US007777197B2

(12) United States Patent
Al-Bayati et al.

(10) Patent No.: US 7,777,197 B2
(45) Date of Patent: Aug. 17, 2010

(54) VACUUM REACTION CHAMBER WITH X-LAMP HEATER

(75) Inventors: Amir Al-Bayati, San Jose, CA (US); Lester A. D'Cruz, San Jose, CA (US); Alexandros T. Demos, Fremont, CA (US); Dale R. Dubois, Los Gatos, CA (US); Khaled A. Elsheref, San Jose, CA (US); Naoyuki Iwasaki, Narita (JP); Hichem M'Saad, Santa Clara, CA (US); Juan Carlos Rocha-Alvarez, Sunnyvale, CA (US); Ashish Shah, Santa Clara, CA (US); Takashi Shimizu, Kawasaki (JP)

(73) Assignee: Applied Materials, Inc., Santa Clara, CA (US)

( * ) Notice: Subject to any disclaimer, the term of this patent is extended or adjusted under 35 U.S.C. 154(b) by 1088 days.

(21) Appl. No.: 11/425,974

(22) Filed: Jun. 22, 2006

(65) Prior Publication Data

US 2006/0272772 A1 Dec. 7, 2006

Related U.S. Application Data

(63) Continuation-in-part of application No. 11/383,383, filed on May 15, 2006, now abandoned, which is a continuation-in-part of application No. 11/143,270, filed on Jun. 2, 2005, now abandoned.

(60) Provisional application No. 60/717,386, filed on Sep. 15, 2005, provisional application No. 60/781,908, filed on Mar. 13, 2006.

(51) Int. Cl.
*G01N 23/00* (2006.01)

(52) U.S. Cl. ................. 250/443.1; 250/492.3; 438/787; 156/345.4

(58) Field of Classification Search ............... 250/443.1
See application file for complete search history.

(56) References Cited

U.S. PATENT DOCUMENTS 3,939,012 A 2/1976 Williams (Continued)

OTHER PUBLICATIONS

Electron Extraction Grid to Prevent Surface Charging, IBM-TBD, NB8406777, 1984, vol. 27, p. 777.*

(Continued)

*Primary Examiner*—David A. Vanore
*Assistant Examiner*—Phillip A. Johnston
(74) *Attorney, Agent, or Firm*—Patterson & Sheridan LLP

(57) ABSTRACT

Methods and apparatus for electron beam treatment of a substrate are provided. An electron beam apparatus that includes a vacuum chamber, at least one thermocouple assembly in communication with the vacuum chamber, a heating device in communication with the vacuum chamber, and combinations thereof are provided. In one embodiment, the vacuum chamber comprises an electron source wherein the electron source comprises a cathode connected to a high voltage source, an anode connected to a low voltage source, and a substrate support. In another embodiment, the vacuum chamber comprises a grid located between the anode and the substrate support. In one embodiment the heating device comprises a first parallel light array and a second light array positioned such that the first parallel light array and the second light array intersect. In one embodiment the thermocouple assembly comprises a temperature sensor made of aluminum nitride.

20 Claims, 17 Drawing Sheets

U.S. PATENT DOCUMENTS

| | | | |
|---|---|---|---|
| 4,242,148 A | 12/1980 | Remmert | |
| 4,297,189 A | 10/1981 | Smith, Jr. et al. | |
| 5,003,178 A | 3/1991 | Livesay | |
| 5,757,018 A | 5/1998 | Mack et al. | |
| 5,864,282 A * | 1/1999 | Hannigan et al. | 338/30 |
| 5,930,546 A | 7/1999 | Lamberts | |
| 5,970,214 A | 10/1999 | Gat | |
| 6,010,056 A | 1/2000 | Swanson | |
| 6,132,814 A * | 10/2000 | Livesay et al. | 438/787 |
| 6,179,835 B1 | 1/2001 | Panescu et al. | |
| 6,207,936 B1 * | 3/2001 | de Waard et al. | 219/497 |
| 6,258,287 B1 * | 7/2001 | Martin et al. | 216/71 |
| 6,310,323 B1 | 10/2001 | Mahawili et al. | |
| 6,346,768 B1 * | 2/2002 | Proudfoot | 313/359.1 |
| 6,504,393 B1 * | 1/2003 | Lo et al. | 324/765 |
| 6,582,777 B1 | 6/2003 | Ross et al. | |
| 6,592,661 B1 | 7/2003 | Thakur et al. | |
| 6,793,114 B2 | 9/2004 | Dunham et al. | |
| 6,839,507 B2 | 1/2005 | Adams et al. | |
| 6,849,857 B2 * | 2/2005 | Ichiki et al. | 250/492.21 |
| 6,857,776 B2 | 2/2005 | Park | |
| 6,911,403 B2 | 6/2005 | Li et al. | |
| 2004/0101632 A1 | 5/2004 | Zhu et al. | |
| 2004/0159638 A1 | 8/2004 | Demos et al. | |
| 2005/0045618 A1 | 3/2005 | Ito | |
| 2005/0070128 A1 | 3/2005 | Xia et al. | |

OTHER PUBLICATIONS

Chinese Office Action for Patent Application No. 2006-8034035.0, dated Jul. 24, 2009.

* cited by examiner

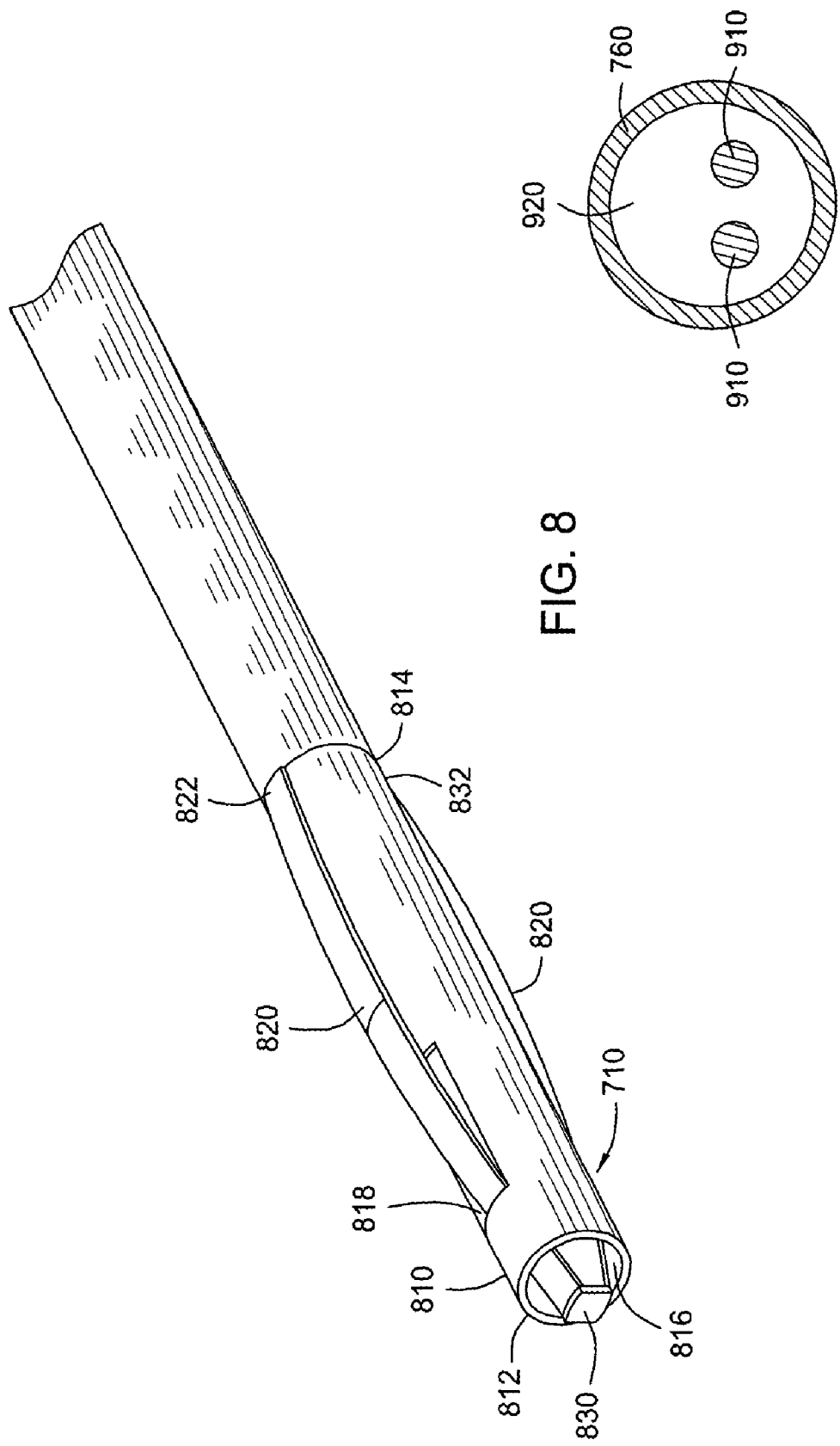

VACUUM REACTION CHAMBER WITH X-LAMP HEATER

CROSS-REFERENCE TO RELATED APPLICATIONS

This application is a continuation-in-part of U.S. Ser. No. 11/383,383, filed May 15, 2006, now abandoned, which is a continuation-in-part of U.S. Ser. No. 11/143,270, filed Jun. 2, 2005, now abandoned. This application also claims benefit of U.S. Ser. No. 60/717,386, filed Sep. 15, 2005; and benefit of U.S. Ser. No. 60/781,908, filed Mar. 13, 2006. Each of the aforementioned related patent applications is herein incorporated by reference.

BACKGROUND OF THE INVENTION

1. Field of the Invention

Embodiments of the present invention generally relate to the fabrication of integrated circuits. More particularly, embodiments of the present invention relate to an apparatus and method for electron beam treatment of a substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 μm and even 0.1 μm feature sizes, and tomorrow's facilities soon will be producing devices having even smaller feature sizes.

The continued reduction in device geometries has generated a demand for films having lower dielectric constant (k) values because the capacitive coupling between adjacent metal lines must be reduced to further reduce the size of devices on integrated circuits. In particular, insulators having low dielectric constants, less than about 4.0, are desirable. Examples of insulators having low dielectric constants include spin-on glass, fluorine-doped silicon glass (FSG), and polytetrafluoroethylene (PTFE), which are all commercially available.

More recently, organosilicon films having k values less than about 3.5 have been developed. One method that has been used to develop low dielectric constant organosilicon films has been to deposit the films from a gas mixture comprising one or more organosilicon compounds and then post-treat the deposited films to remove volatile or thermally labile species, such as organic groups, from the deposited films. The removal of the volatile or thermally labile species from the deposited films creates voids in the films, which lowers the dielectric constant of the films, as air has a dielectric constant of approximately 1.

Electron beam treatment has been successfully used to post-treat the deposited films and create voids in the films, while also improving the mechanical properties of the films. However, current electron beam chamber designs suffer from several major drawbacks. First, current electron beam chamber designs can have negative side effects on a substrate, such as damage or destruction of semiconductor devices on a substrate. For example, high gate oxide leakage and voltage threshold ($V_T$) shift have been observed after electron beam treatment. It is believed that the electron beam treatment damages substrates by causing an excess negative charge build up on the substrates from the electrons bombarding the substrate. The excess negative charge build up during device manufacturing can create charge currents that form undesirable current paths in areas of the substrate that are normally insulating, and leakage current through the newly created current paths during operation of the devices can destroy the devices on the substrate. Second, current electron beam chamber designs have contributed to heavy metal contamination of substrates. Third, poor within substrate shrinkage due to a lack of temperature uniformity across the substrate surface has been exhibited. Shrinkage uniformity is an indication of film properties such as hardness.

Thus there remains a need for an improved apparatus and method of electron beam treatment of a deposited layer on a substrate.

SUMMARY OF THE INVENTION

Accordingly, the present invention provides an apparatus and method that solves the aforementioned problems.

Embodiments of the invention provide an electron beam apparatus for processing a substrate. In one embodiment, the electron beam apparatus for processing a substrate comprises a vacuum chamber. The vacuum chamber comprises an electron source. The electron source comprises an anode, a low voltage source connected to the anode, a cathode, and a high voltage source connected to the cathode. The vacuum chamber further comprises a substrate support and a grid configured to reduce damage to the substrate during electron beam treatment, wherein the gird is located between the anode and the substrate support. A bias source is connected to the grid. In one embodiment, the vacuum chamber further comprises a cross lamp heating device. In another embodiment, the vacuum chamber further comprises at least one thermocouple assembly. In another embodiment the thermocouple assembly comprises a resilient member made of ceramic material. In another embodiment the ceramic material is selected for a group consisting of silicon carbide, silicon nitride, aluminum nitride, synthetic diamond and combinations thereof.

In another embodiment, a method of reducing charging damage to a substrate during electron beam treatment is provided. The method comprises providing a chamber comprising a grid located between an anode and a substrate support and applying a bias voltage to the grid, wherein the bias voltage is provided at conditions sufficient to fully or partially neutralize the electron beam charge on the substrate. In one embodiment, the conditions are sufficient to reduce the substrate charge current to less than about 0.005 mA. In one embodiment, the bias voltage is a DC bias. In another, the bias voltage is a RF bias. In another embodiment, the substrate comprises a low dielectric constant film, and electron beam treatment of the low dielectric constant film comprises forming voids in the low dielectric constant film. In one embodiment the bias voltage is between about 3 V and about 40 V. In another embodiment, the bias voltage is between about −3 V and about −30 V.

In another embodiment, an electron beam apparatus for processing a substrate is provided. The vacuum chamber comprises an electron source. The electron source comprises a cathode connected to a high voltage power supply and an anode connected to a low voltage power supply. The vacuum chamber further comprises a substrate support and a grid located between the anode and the substrate support, wherein the grid is connected to a bias source, and a cross lamp heating device located below the substrate support. In one embodiment, the vacuum chamber further comprises at least one thermocouple assembly, wherein the at least one thermocouple assembly comprises a resilient member configured to contact the surface of the substrate, wherein the resilient member comprises a ceramic material. In another embodiment, the substrate support comprises at least one thermocouple assembly. In one embodiment the thermocouple assembly comprises a resilent member comprising a ceramic material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8 is a perspective view of one embodiment of a thermocouple tip shown in FIG. 7;

FIG. 9 is a cross sectional view of the exemplary thermocouple assembly of FIG. 7 taken along line 9-9 on FIG. 7;

DETAILED DESCRIPTION

Embodiments of the invention provide methods and apparatus for reducing charging damage to a substrate during electron beam treatment, reducing substrate contamination, and reducing substrate shrinkage. Generally, the methods and apparatus described herein increase the concentration of positive ions near the substrate, allow secondary electrons to leave the substrate, and allow for greater temperature control across the surface of the substrate while reducing substrate contamination during electron beam treatment. The method and apparatus herein further provide an improved method and apparatus for temperature control.

Substrates that may be treated according to embodiments of the invention include silicon or silicon-containing substrates, patterned substrates, such as substrates having semiconductor devices thereon, and unpatterned or bare substrates. In one embodiment, the substrate comprises a low dielectric constant film that is preferably post-treated with an electron beam to remove volatile species, thus forming pores and lowering the dielectric constant of the film. The low dielectric constant film may be deposited from a mixture comprising an organosilicon compound, a hydrocarbon compound, an optional oxidizer, and/or combinations thereof.

The Electron Beam Apparatus:

In one embodiment, a negative substrate bias is applied during the electron beam treatment to reduce or eliminate charging damage to the substrate during electron beam treatment. By applying a negative substrate bias, positive ions are accelerated towards the substrate. The positive ions neutralize the negative charges that may accumulate on the substrate during electron beam treatment and cause undesirable current paths during manufacturing of devices on the substrate. The negative bias also prevents secondary electrons, generated from the substrate, from returning to the substrate.

Figure 1:
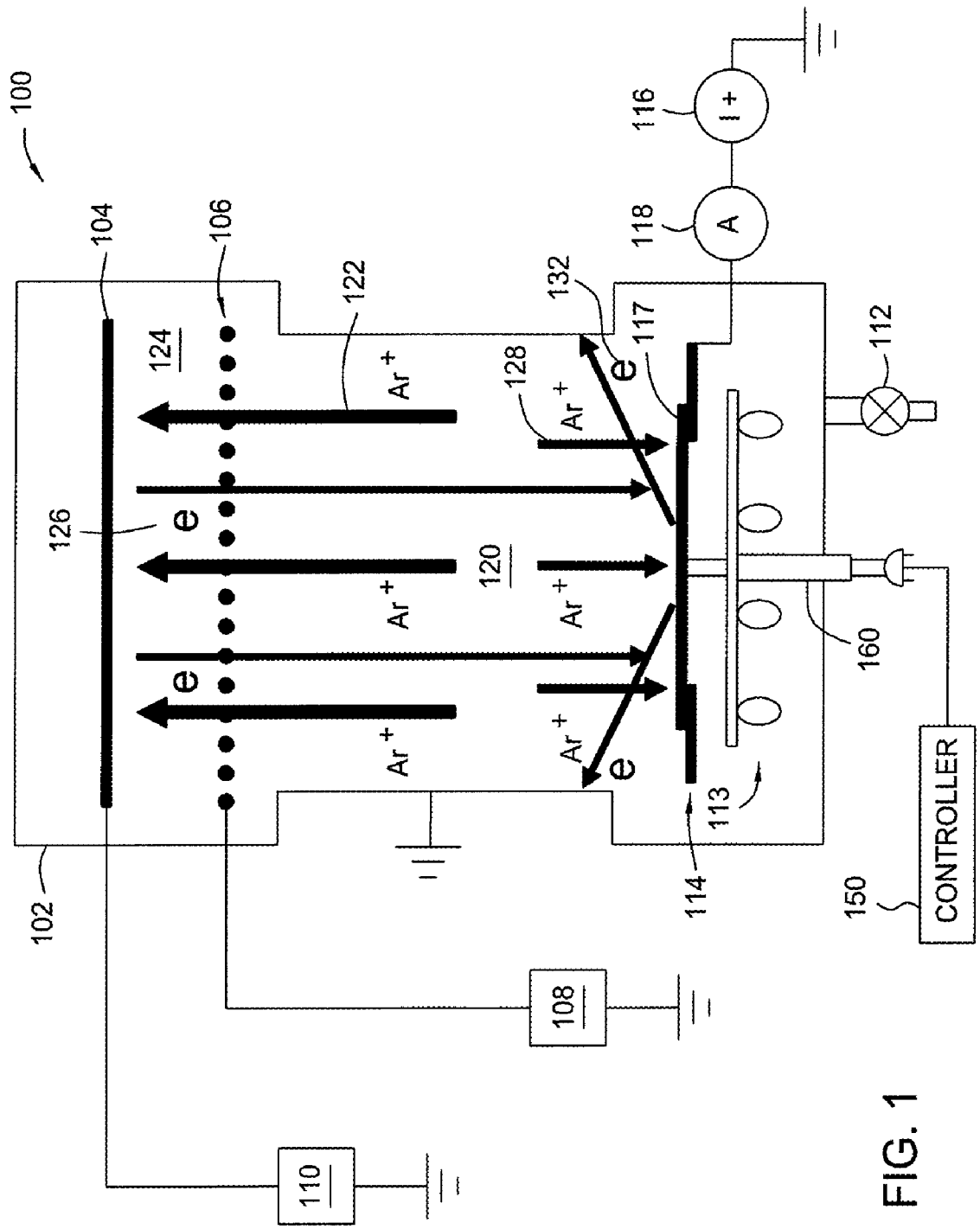
FIG. 1 is a cross-sectional view of an electron beam apparatus according to an embodiment of the invention.

FIG. 1 is a cross-sectional view of an electron beam apparatus 100 that may be used for practicing embodiments of the invention. The electron beam apparatus 100 includes a chamber 102 having a cathode 104 and an anode 106 disposed therein. The anode may be perforated, such as a grid anode. The cathode 104 and the anode 106 are electrically isolated by an insulator (not shown) therebetween. The cathode 104 is connected to a variable high voltage power supply 110 outside of the chamber 102. The anode 106 is connected to a variable low voltage power supply 108 outside of the chamber 102. The chamber 102 also includes a variable rate leak valve 112 for controlling the pressure inside the chamber 102. The chamber may further include a heating device 113, e.g., one or more lamps, such as halogen lamps, for heating a substrate during electron beam treatment. The heating device 113 is arranged for single sided heating with the heating device 113 positioned below the substrate 117. In one embodiment, the heating device 113 is placed above the substrate. In one embodiment, the heating device 113 is separated from the substrate 117 by a window (not shown). The window may be made of quartz. In one embodiment, the heating device 113 is located outside of the vacuum chamber 102 allowing for easy removal and replacement of the heating device 113 without impacting the vacuum integrity. The heating device 113 will be described in further detail below. A substrate support 114 in the chamber is connected to a substrate bias source 116 that supplies a substrate bias to a substrate 117 supported on the substrate support 114. The substrate bias source 116 may be a variable DC bias source or a variable RF bias source. The apparatus 100 may also include a current meter 118, e.g., an ammeter, to measure the charge flow on a substrate supported on the substrate support 114. The current meter 118 may be located outside of the chamber 102 between the substrate bias source 116 and the substrate support 114. The substrate support 114 may contain at least one hole that extends through the vacuum chamber 102, for embedding a temperature measuring element such as a thermocouple assembly 160. The thermocouple assembly 160 contacts the substrate 117. The thermocouple assembly 160 is connected to a controller 150. In one embodiment more than one thermocouple is included in the vacuum chamber 102. In another embodiment the thermocouple assembly 160 functions as a substrate support.

In operation, according to an embodiment of the invention, a substrate is placed on the substrate support 114 in the vacuum chamber 102. The substrate support 114 is electrically isolated from ground. The chamber is then pumped down from atmospheric pressure to a pressure between about 1 mTorr and about 100 mTorr. A variable rate leak valve 112 is used in controlling the pressure.

The electron beam is typically generated at a high voltage, which is applied to the cathode 104 by the high voltage power supply 110. The high voltage may be between about −500 V to about 30,000 V, or higher. The variable low voltage power supply 108 applies a voltage to the anode 106 that is positive relative to the voltage applied to the cathode 104.

To initiate electron emission in the apparatus, gas in ionization region 120 between the anode 106 and the substrate support 114 must be ionized. The gas may include one or more of argon, helium, nitrogen, hydrogen, oxygen, ammonia, neon, krypton, and xenon, for example. In one embodiment, the gas includes argon. The ionization may be initiated by naturally occurring gamma rays or by a high voltage spark in the chamber 102. Following the initial ionization, the anode 106 is biased with a slightly negative voltage, e.g., between about 0 V and about −250 V to attract positive ions 122, e.g., argon ions, to the anode 106. The positive ions 122 pass into an accelerating field region 124 disposed between the cathode 104 and the anode 106 and are accelerated towards the cathode 104 as a result of the high voltage (e.g., form about −500 V to about 30,000 V applied to the cathode). Upon striking the cathode 104, the positive ions produce electrons 126 that are accelerated back towards the anode 106. While some of the electrons strike the anode, many of the electrons continue on through the anode 106 to contact the substrate 117 on the substrate support 114.

An excess negative charge accumulation on the substrate 117 from the electrons 126 contacting the substrate is prevented by providing a negative bias to the substrate 117 during the electron beam treatment. The negative bias is provided to the substrate 117 by bias source 116 that is connected to the substrate support 114. The bias applied to the substrate may be a DC bias. Alternatively, the bias may be a RF bias, such as for applications involving electron beam treatment of SOI (silicon on insulator) substrates. The negative bias on the substrate 117 attracts some of the positive ions 128, e.g., positive argon ions, in the chamber and accelerates the positive ions 128 towards the substrate 117, resulting in a partial or total neutralization of the negative charges on the substrate 117. The negative bias on the substrate 117 also prevents secondary electrons 132, generated from the primary electron bombardment of the substrate 117, from returning to the substrate 117. These secondary electrons 132 are drained to a ground, such as the grounded chamber wall. Both the capture of the positive ions 128 and the elimination of secondary electrons 132 help to neutralize the negative charge on the substrate 117. The remaining charge on the substrate may induce a charge current on the substrate of less than about 0.005 mA, such as less than about 0.002 mA, e.g., between about 0.001 mA and about 0.002 mA. In one embodiment, the remaining charge current on the substrate is 0 mA or about 0 mA. Without a substrate bias, the substrate charge current is generally approximately equivalent to the electron beam current, which is typically between about 0.5 mA and about 50 mA. Preferably, the negative bias on the substrate 117 is between about −10 and about −30 V, such as between about −20 and about −23 V. However, the optimal substrate bias, which results in a substrate charge current of 0 mA, may vary depending on the electron beam conditions used to treat the substrate.

Exemplary electron beam conditions that may be used include a chamber temperature of between about 200° C. and about 600° C., e.g. about 350° C. to about 400° C. The electron beam energy may be from about 0.5 keV to about 30 keV. The exposure dose may be between about 1 $\mu C/cm^2$ and about 400 $\mu C/cm^2$. The chamber pressure may be between about 1 mTorr and about 100 mTorr. The electron beam current may be between about 0.5 mA and about 50 mA. The electron beam conditions provided herein may be used with the apparatus of FIG. 1 as well as the apparatus of FIGS. 3, 5, 6, 17, 18, and 19. The electron beam conditions may also be used with other apparatus.

Figure 3:
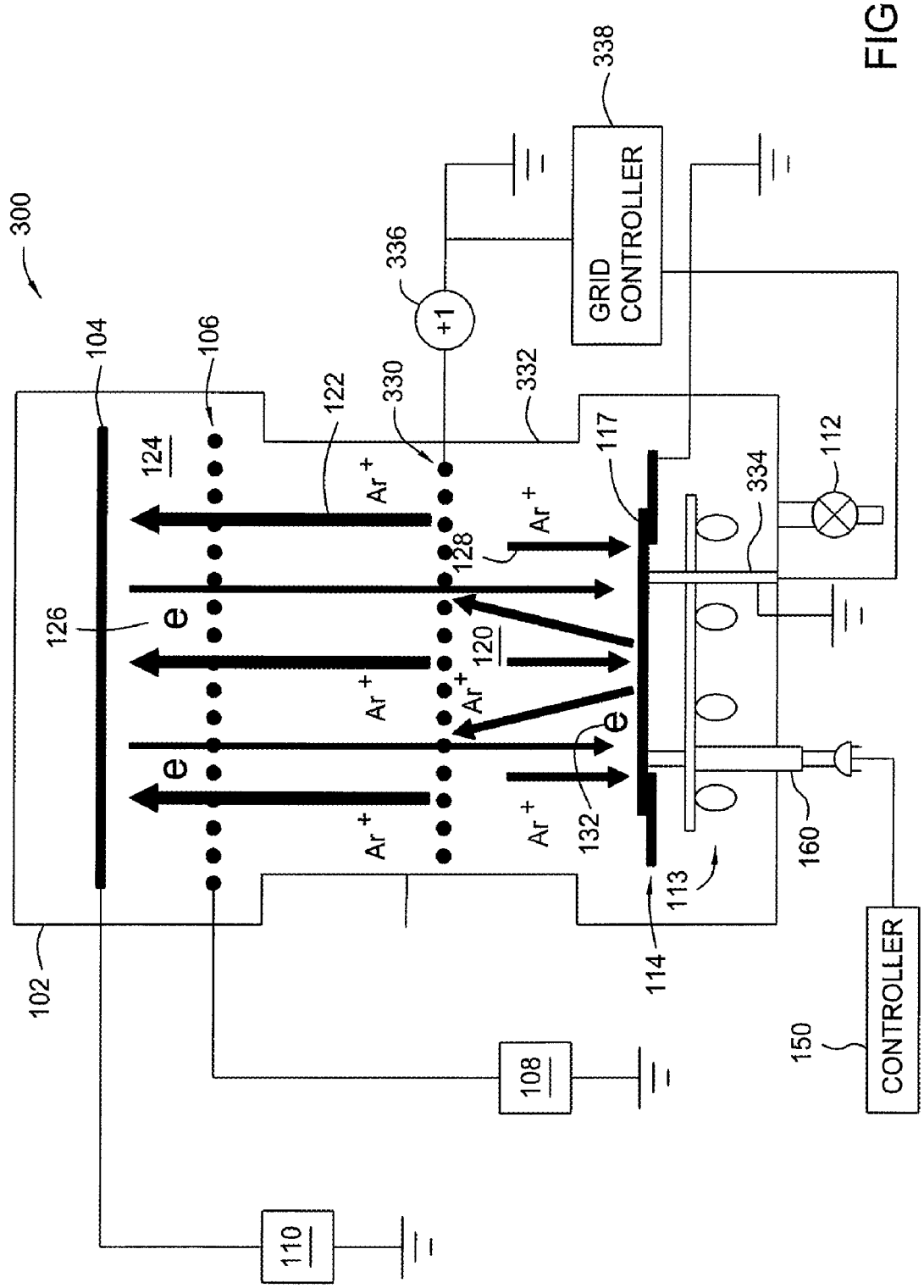
FIG. 3 is a cross-sectional view of an electron beam apparatus according to another embodiment of the invention.

FIG. 3 is a cross-sectional view of another electron beam apparatus 300 that may be used for practicing embodiments of the invention. Components that are identical to the components of the electron beam apparatus of FIG. 1 are labeled with the same reference numbers. Unlike apparatus 100 of FIG. 1, the substrate support 114 of FIG. 3 is not connected to a substrate bias source. While the substrate support 114 of FIG. 3 is shown as a ring as in FIG. 1, a substrate in the apparatus 300 of FIG. 3 may actually be supported on three contact points. One of the three contact points may be a thermocouple assembly 160. Although only one thermocouple assembly 160 is shown, any of the three contact points may comprise a thermocouple assembly. The thermocouple assembly 160 is connected to a controller 150. In one embodiment more than one thermocouple assembly is included in the vacuum chamber 102. Supporting the substrate on a three point plane helps provide good temperature control of the substrate, as the substrate is in uniform contact with its supporting surface. Other embodiments may include any number of contact points comprising thermocouples and/or grounded pin(s) 334.

Figure 15:
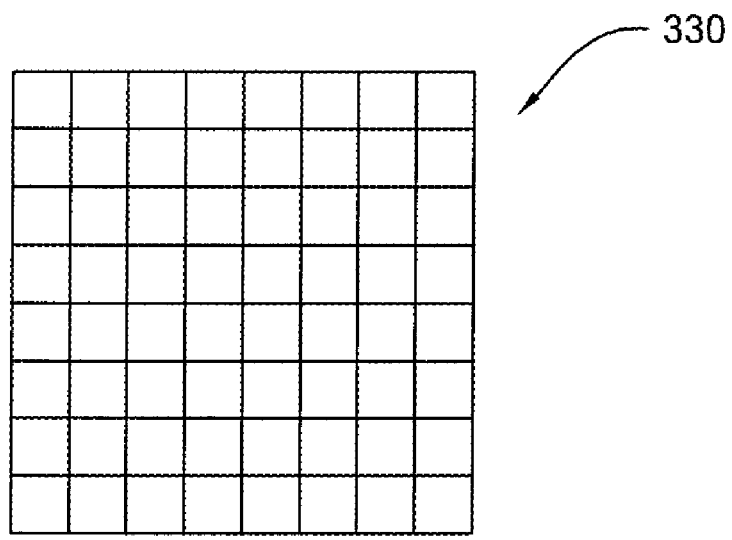
FIG. 15 is a perspective view of one embodiment of a grid of the current invention.
Figure 16:
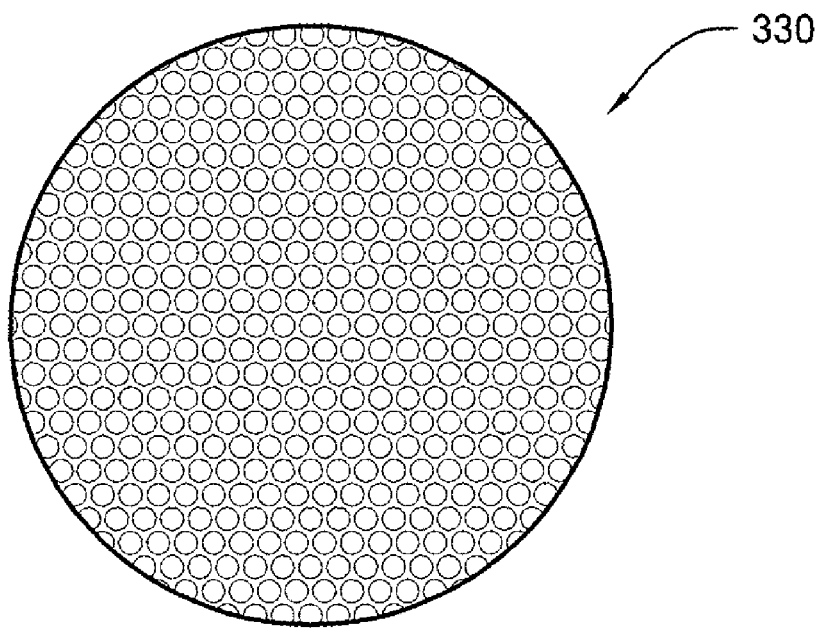
FIG. 16 is a perspective view of another embodiment of a grid of the current invention.

The apparatus 300 of FIG. 3 also includes a grid 330 between the anode 106 and the substrate support 114. The grid is attached to the sidewalls 332 of the chamber and is grounded. The grid 330 may have the same dimensions, such as circumference, as the anode 106 or cathode 104. With reference to FIG. 15, the grid 330 comprises a conductive wire, such as aluminum, that has openings that provide a mesh structure to the grid 330. The openings may be square and have dimensions of several mm by several mm, such as 10 mm×10 mm. Another embodiment of the grid 330 is shown in FIG. 16. In the embodiment of FIG. 16, the grid 330 has staggered holes. The diameter of each hole is approximately 0.125 cm with a spacing of 0.145 cm. The diameter of the grid 330 is approximately 31.75 cm and the thickness of the grid is approximately 0.229 cm. The grid comprises a material such as aluminum and has a transparency of 66%. In one embodiment (not shown), the grid is formed of an aluminum wire having a diameter of 10 mils and 66% transparency. The grid 330 is connected to a bias source 336 that supplies a positive voltage to the grid 330. The bias source 336 may be a RF bias source or a DC bias source.

Electron emission in the apparatus 300 is initiated and maintained as described above with respect to apparatus 100 of FIG. 1. Briefly, the positive ions 122, e.g., argon ions, strike the cathode 104 and provide secondary electrons that contact and treat the substrate 117. A negative field extending from the anode 106 accelerates the electrons towards the substrate 117, which can cause an excess negative charge accumulation on the substrate. While there are positive ions in the chamber 102 that can neutralize the excess negative charge, the negative field extending from the anode 106 also causes the positive ions to accumulate towards the anode 106 rather than towards the substrate 117, where they could neutralize the charges on the substrate 117. By applying a positive bias voltage to the grid 330, the effect of the negative field that extends from the anode 106 is terminated at the grid 330. Thus, the effect of a force, i.e., the anode's negative field, that was previously preventing positive ions from reaching the substrate and neutralizing negative charges on the substrate 117, may be minimized by the grid 330. Also, the positive grid bias pushes positive ions away from the grid 330 and towards the substrate 117 where the positive ions can neutralize the negative charges on the substrate 117. The grid 330 also captures secondary electrons 132. Both the capture of the positive ions 128 and the elimination of secondary electrons 132 help to neutralize the negative charge on the substrate 117. The remaining charge on the substrate 117 may induce a charge current on the substrate 117 of less than about 0.005 mA, such as less than about 0.002 mA, e.g., between about 0.001 mA and about 0.002 mA. In one embodiment, the remaining charge current on the substrate 117 is 0 mA or about 0 mA.

The grid 330 is connected with a grid controller 338. In this embodiment, the grid controller 338 is connected with the pin 334. The grid controller 338 allows the user to input a substrate current "set point" into the grid controller 338 based on the selected process recipe and desired results. In a closed loop configuration, the current leaving the substrate is measured via the pin 334 and relayed to the grid controller 338. The grid controller 338 adjusts the voltage of the grid 330 until the substrate current equals the "set point, for example 0 mA. In an open loop configuration the desired grid voltage is input into the grid controller 338 and applied to the grid 330. In one embodiment, the grid controller 338 comprises a PID controller and at least one amplifier. The grid controller may also be connected with the thermocouple 160 or the substrate support 114.

The positive bias voltage that is applied to the grid 330 during the electron beam treatment of a substrate is provided at conditions sufficient to fully or partially neutralize the electron beam charge on the substrate. In one embodiment, the positive bias applied to the grid 330 is between about 3 V and about 30 V. However, it is recognized that the optimal grid bias voltage, which results in a substrate current charge of 0 mA, may vary depending on the electron beam conditions used to treat the substrate. For example, a higher grid bias voltage is required as the energy of the electron beam treatment is increased. The optimal grid bias voltage may also vary depending on the electrical field properties of the substrate itself, such as the substrate's tendency to accumulate negative charge.

Figure 4A:
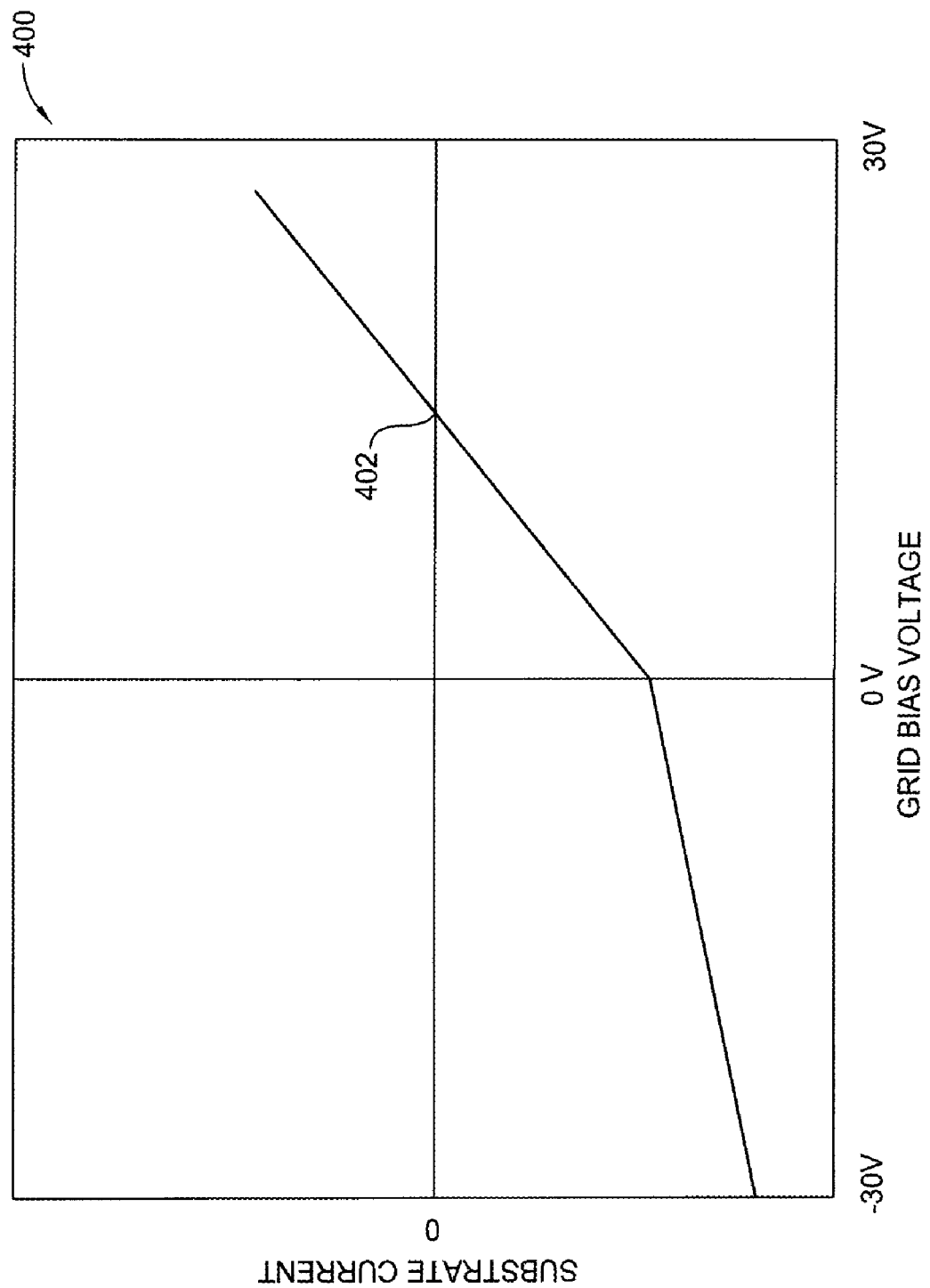
FIG. 4A is a graph showing substrate current vs. grid bias voltage during an electron beam treatment according to an embodiment of the invention.

FIG. 4A is a graph 400 showing substrate current vs. grid bias voltage generally during an electron beam treatment according to an embodiment of the invention. The x-axis represents grid bias voltage from −30 V to 30 V. The y-axis represents the substrate current on the substrate. $I_S$ represents the substrate current. $I_{PE}$ represents the primary electron current. $I_{SE}$ represents the secondary electron current. $I_{AR}$ represents the argon current. With reference to FIG. 4A as the grid bias voltage increases from −30 V to 0 V, the $I_{SE}$ increases thus leading to a reduction in $I_S$. From −30 V to 0 V, there is no $I_{AR}$. As the grid bias voltage increases from 0 V to approximately 15 V, both $I_{AR}$ and $I_{SE}$ increase leading to $I_S$ reduction. The optimal grid bias voltage is achieved when the substrate current is zero, represented by point 402. When the substrate current is zero at point 402, $I_{PE}$ equals the sum of $I_{SE}$ and $I_{AR}$. As the grid bias voltage increases, $I_{AR} \gg (I_{PE}-I_{SE})$ thus reducing $I_S$ by making it more positive.

Figure 4B:
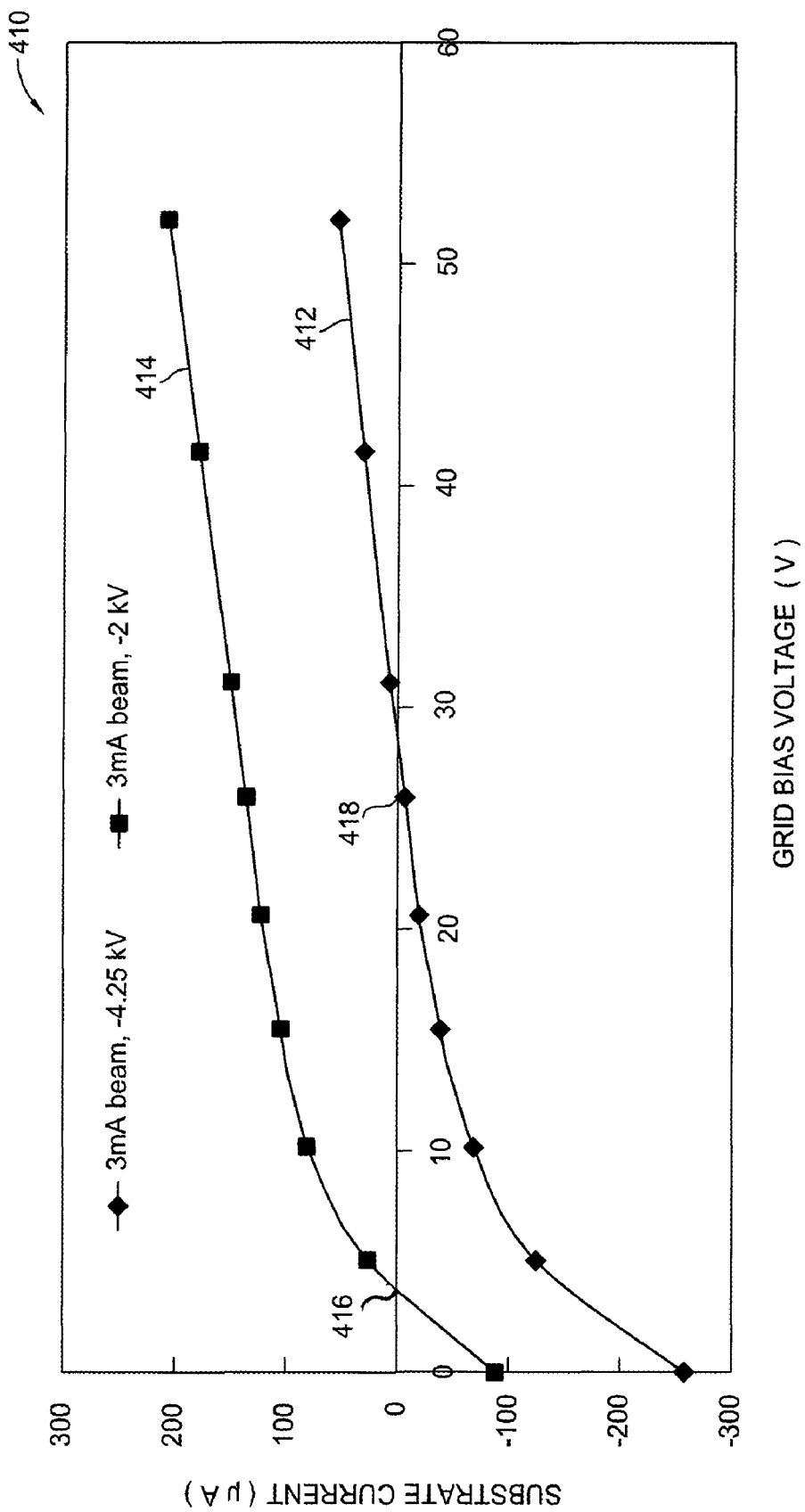
FIG. 4B is a graph showing substrate current vs. grid bias voltage during an electron beam treatment according to an embodiment of the invention.

FIG. 4B is a graph 410 showing substrate current (μA) vs grid bias voltage (V) during an electron beam treatment for a specific example according to an embodiment of the invention. The x-axis represents grid bias voltage from 0 V to 60 V. The y-axis represents the substrate current on the substrate ($I_S$) from −300 μA to 300 μA. For line 412, a bare silicon substrate was electron beam treated under the following conditions: an electron beam energy of −4.25 keV, an anode voltage of −125 V, an electron beam current of 3.0 mA, an argon flow of 100 sccm, and a substrate temperature of 350° C. The charge current on the substrate was measured at different substrate DC bias voltages represented by line 412. For line 414, a bare silicon substrate was electron beam treated under the following conditions: an electron beam energy of −2.0 keV, an anode voltage of −125 V, an electron beam current of 3.0 mA, an argon flow of 100 sccm, and a substrate temperature of 350° C. The charge current on the substrate was measured at different substrate DC bias voltages represented by line 412. Since $I_{SE}$ for −2.0 keV is greater than $I_{SE}$ for −4.25 keV, more $I_{AR}$ is needed to make $I_S$ equal to 0 for −4.25 keV than −2.0 keV. The results show that approximately 5 V of grid bias voltage is required to for $I_S$ to equal zero, shown as point 416, for −2 keV. The results also show that approximately 25 V is required for Is to equal zero, shown at point 418, for −4.25 keV.

Upon performing electron beam treatments of a substrate using a chamber according to FIG. 3, it was found that a grid bias voltage of between about 5 V and about 25 V was sufficient to neutralize the electron beam charge on substrates treated with an electron beam energy of between −2.0 keV and −4.25 keV. A grid bias voltage of about 5 V was sufficient to neutralize the electron beam charge on substrates treated with an electron beam current between 1 mA and 4 mA at −2 keV and 400° C. Thus, it was found that the grid bias voltage required to neutralize the electron beam charge may not change over a range of electron beam currents.

Figure 5:
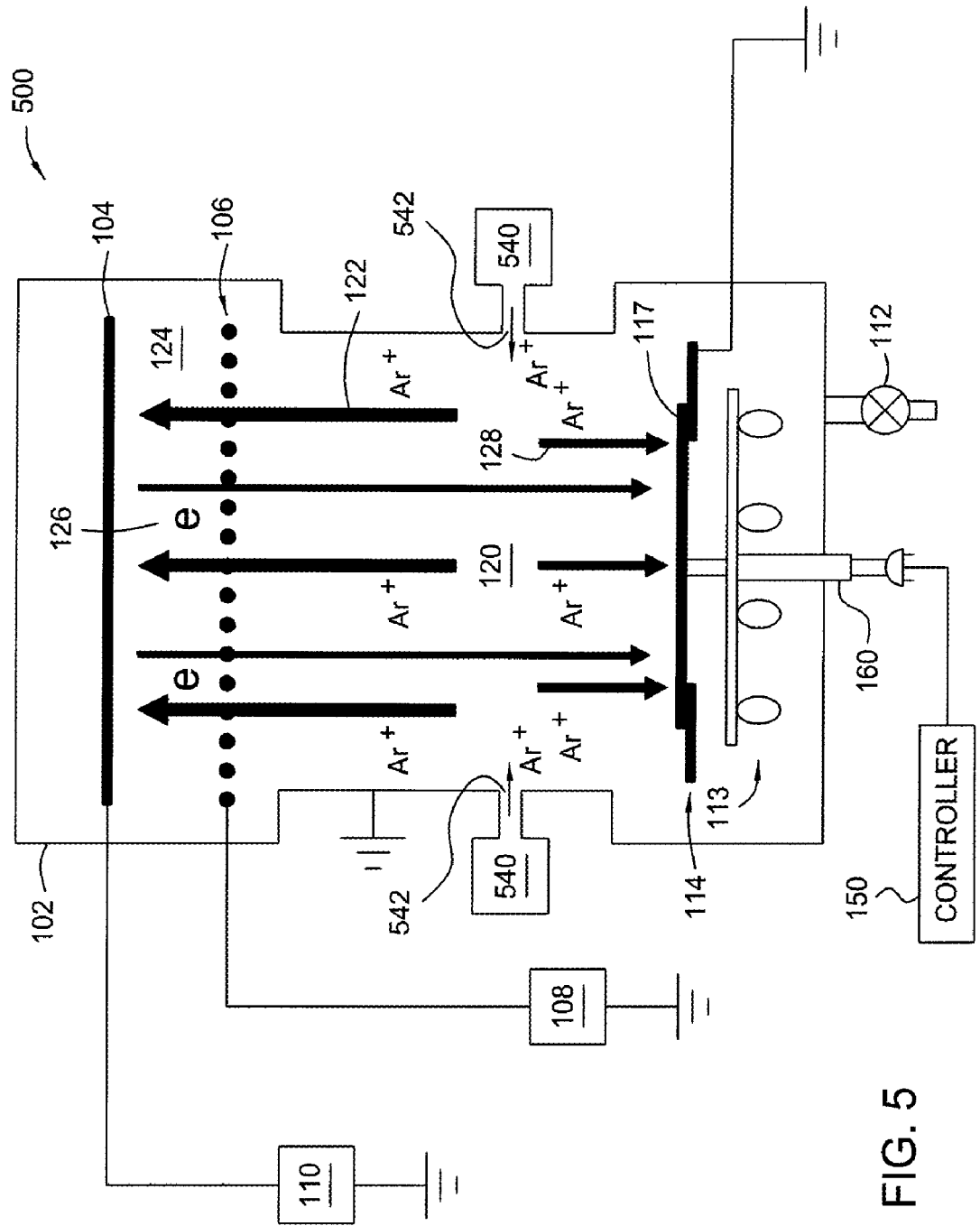
FIG. 5 is a cross-sectional view of an electron beam apparatus according to another embodiment of the invention.

FIG. 5 is a cross-sectional view of another electron beam apparatus 500 that may be used for practicing embodiments of the invention. The apparatus 500 is similar to the apparatus 100 shown in FIG. 1 with the exceptions that the substrate support 114 of apparatus 500 is not connected to a substrate bias source, and the apparatus 500 further includes a plasma flood gun 540. The plasma flood gun 540 may be connected to the side of the chamber 102 to introduce low energy ions, i.e., ions having an energy of less than about 5 eV, such as low energy Ar ions, through an inlet 542 in the side of the chamber 102. The plasma flood gun 540 and inlet 542 may be positioned between the anode 106 and the substrate support 114 such that the positive ions provided to the chamber by the plasma flood gun 540 are provided near the substrate support 114 to locally increase the concentration of positive ions near the substrate 117 on the substrate support 114, and thus neutralize the electron beam charge on the substrate 117. The plasma flood gun 540 also provides electrons to the chamber 102, and thus, an excess positive charge accumulation on the substrate 117 is prevented.

EXAMPLES

The following examples illustrate embodiments of the invention. The substrates in the examples were 300 mm substrates that were treated in an EBk™ electron beam chamber available from Applied Materials, Inc. of Santa Clara, Calif.

Example 1

Figure 2A:
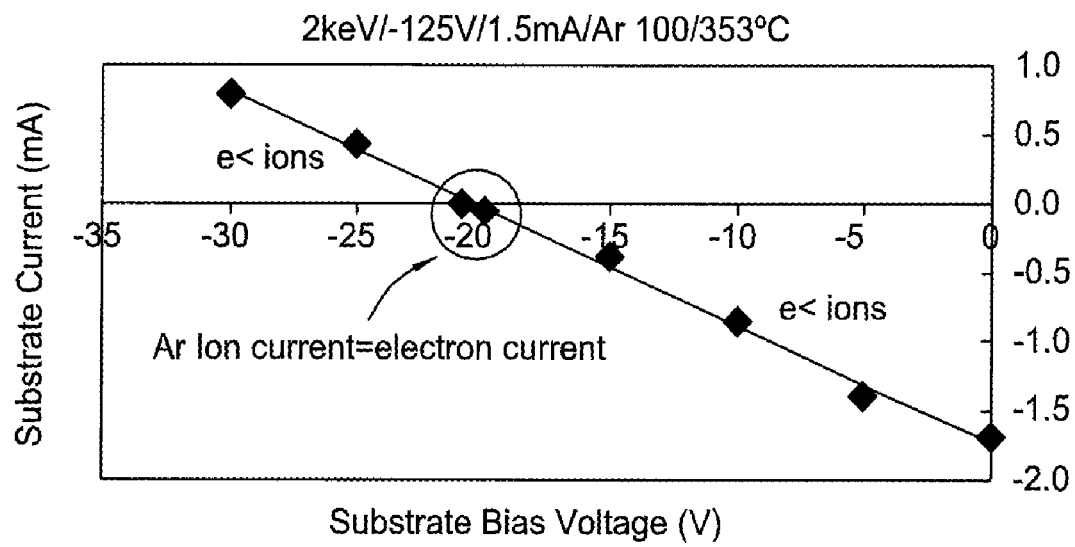
FIG. 2A is a graph showing substrate charge current vs. substrate bias voltage during an electron beam treatment according to an embodiment of the invention.

A bare silicon substrate was electron beam treated an apparatus as shown in FIG. 1 under the following conditions: an electron beam energy of 2 keV, an anode voltage of −125 V, an electron beam current of 1.5 mA, an argon flow of 100 sccm, and a substrate temperature of 353° C. The charge current on the substrate was measured at different substrate DC bias voltages. FIG. 2A is a graph showing the charge current on the substrate at different substrate DC bias voltages.

Example 2

Figure 2B:
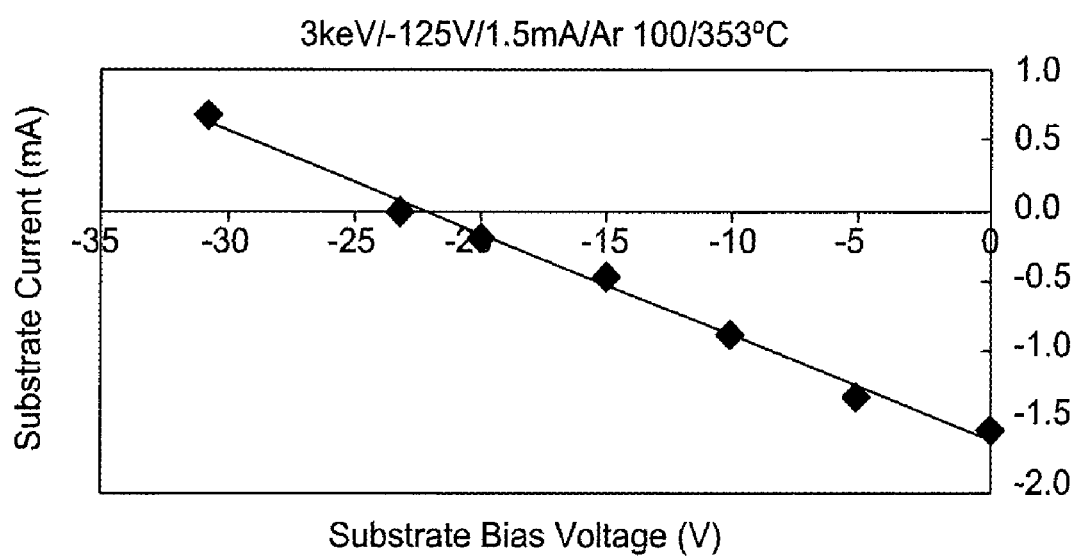
FIG. 2B is a graph showing substrate charge current vs. substrate bias voltage during an electron beam treatment according to another embodiment of the invention.

A bare silicon substrate was electron beam treated under the following conditions: an electron beam energy of 3 keV, an anode voltage of −125 V, an electron beam current of 1.5 mA, an argon flow of 100 sccm, and a substrate temperature of 353° C. The charge current on the substrate was measured at different substrate DC bias voltages. FIG. 2B is a graph showing the charge current on the substrate at different substrate DC bias voltages.

FIG. 2A shows that a substrate charge current of 0 mA or about 0 mA was obtained when a substrate bias voltage of approximately −20 V was applied to the substrate during an electron beam treatment having an energy of 2 keV. FIG. 2B shows that a substrate charge current of 0 mA or about 0 mA was obtained when a substrate bias voltage of approximately −23 V was applied to the substrate during an electron beam treatment having an energy of 3 keV. Thus, FIGS. 2A and 2B illustrate that embodiments of the invention provide a method of producing a substrate charge current of about 0 mA during electron beam treatment and thus provide a method of reducing charging damage that may occur due to excess negative charge accumulation on substrates during electron beam treatment. A substrate charge current of about 0 mA indicates that the positive ion current at the substrate is substantially equal to the electron current at the substrate.

While the results described above with respect to Examples 1 and 2 were obtained using bare silicon substrates, similar results, i.e., a substrate charge current of approximately 0 mA at a substrate bias of −20 V, were obtained with patterned substrates containing semiconductor devices. It was also observed that applying negative bias to the substrate did not significantly affect the energy of the electron beam treatment. For example, using a 2 keV electron beam treatment and substrate bias of −20 V, a final electron beam energy of 1.98 keV was observed, illustrating that the substrate bias did not substantially reduce the electron beam energy.

It is also believed that applying a substrate bias as described herein may enhance sealing of pores that are located near the substrate surface and are created during electron beam treatment of substrates having low dielectric constant films thereon, as the substrate bias provides a very low energy ion bombardment to substrates.

Example 3

Silicon substrates having a film of Black Diamond IIx (process conditions available from Applied Materials, Inc. of Santa Clara, Calif.) deposited thereon were electron beam treated in an apparatus as shown in FIG. 3 under the following conditions: an electron beam energy of 3.3 keV, an anode voltage of −125 V, an electron beam current of 1.5 mA, an argon flow of 100 sccm, and a substrate temperature of 400° C. The grounded aluminum wire grid of the apparatus had 66% transparency, a wire diameter of 10 mils, and 0.011 inch diameter openings. The charge current on the substrates was measured at different grid bias voltages. The charge current on the substrates increased as the grid bias voltage was increased and reached 0 at a grid bias voltage of 25 V. The properties, including thickness, refractive index, shrinkage, thickness uniformity, dielectric constant, and stress, of the Black Diamond IIx films after the electron beam treatments were comparable to the properties of Black Diamond IIx films that were electron beam treated under similar conditions in a chamber that did not include a grid that was positively biased as shown and described with respect to FIG. 3.

The Thermocouple:

Embodiments of the present invention also provide a thermocouple assembly comprising a ceramic tip. Although primarily discussed with processing chamber 600, the thermocouple assembly 160 may also be used with the aforementioned chambers as well as other processing chambers including but not limited to CVD, PVD, PECVD or any other processing or manufacturing chambers requiring temperature monitoring.

Figure 6:
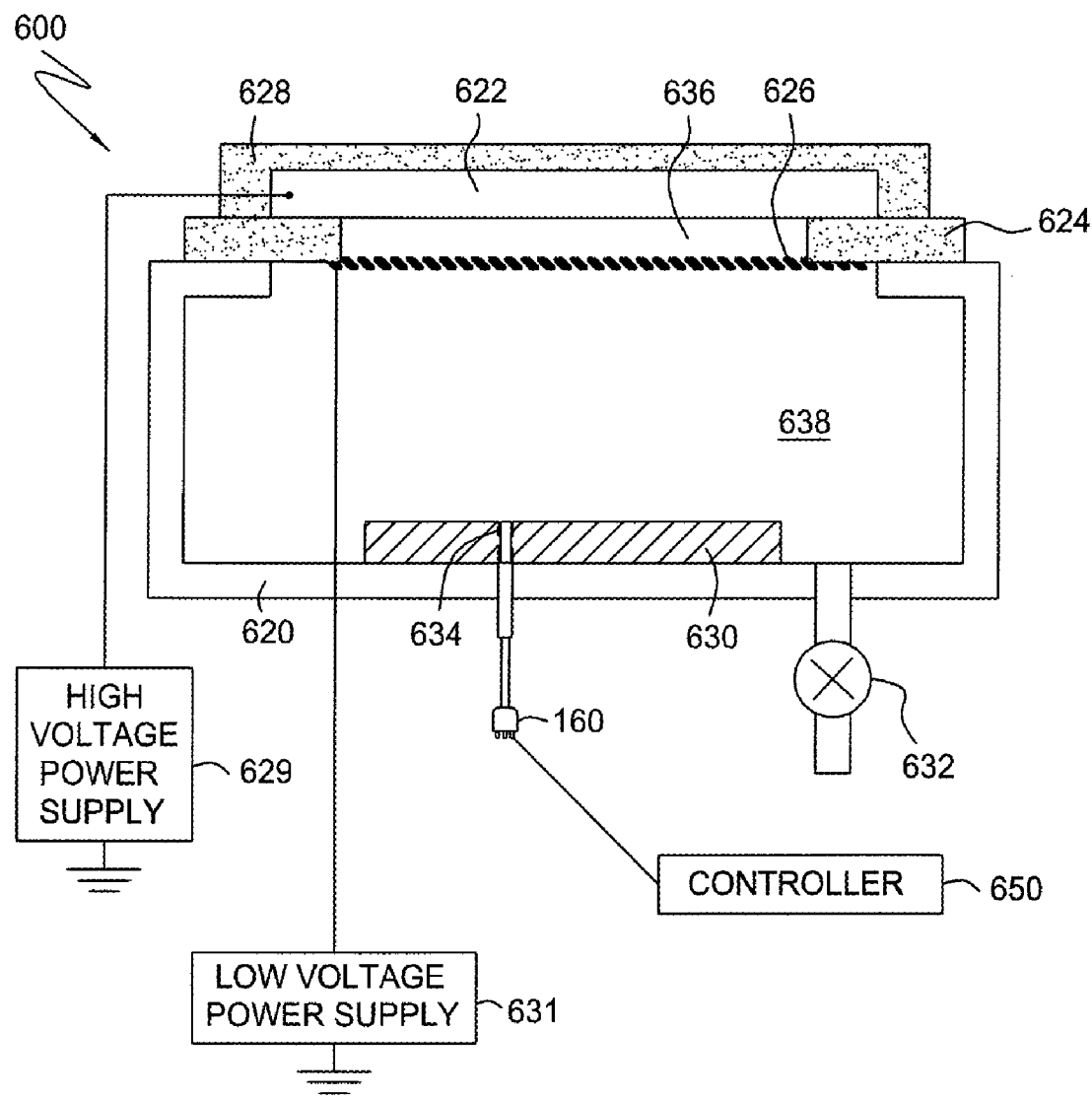
FIG. 6 is a cross-sectional diagram of an electron beam apparatus according to another embodiment of the invention.

FIG. 6 is a cross-sectional diagram of an exemplary processing chamber 600, the e-beam chamber, in accordance with an embodiment of the invention. The e-beam chamber 600 includes a vacuum chamber 620, a large-area cathode 622, a target plane or substrate support 630 located in a field-free region 638, and a grid anode 626 positioned between the target plane 630 and the large-area cathode 622. The target plane 630 contains at least one hole 634 that extends through the vacuum chamber 620, for embedding a temperature measuring element such as a thermocouple assembly 160. The thermocouple assembly 160 is connected to a controller 650. The e-beam chamber 600 further includes a high voltage insulator 624 and an accelerating field region 636 which isolates the grid anode 626 from the large-area cathode 622, a cathode cover insulator 628 located outside the vacuum chamber 620, a variable leak valve 632 for controlling the pressure inside the vacuum chamber 620, a variable high voltage power supply 629 connected to the large-area cathode 622, and a variable low voltage power supply 631 connected to the grid anode 626.

Other details of the e-beam chamber 600 are described in U.S. Pat. No. 5,003,178, entitled "Large-Area Uniform Electron Source," issued Mar. 26, 1991, and herein incorporated by reference to the extent not inconsistent with the invention.

Figure 7:
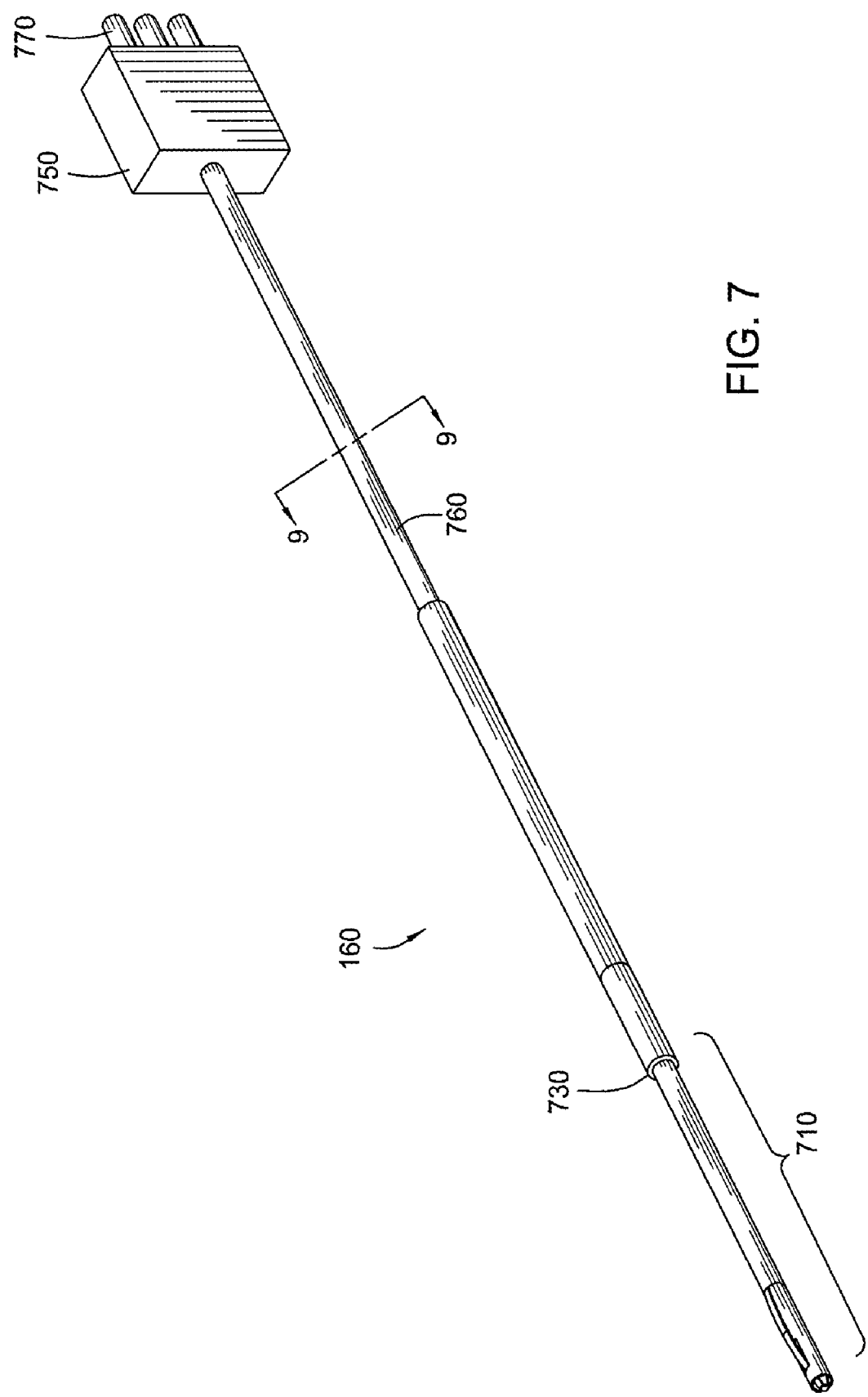
FIG. 7 is a perspective view of one embodiment of a thermocouple assembly.

FIG. 7 is a perspective view of one embodiment of the thermocouple assembly 160. The thermocouple assembly 160 of this embodiment comprises a thermocouple tip 710 coupled to a bushing 730. The thermocouple tip 710 and tapered bushing 730 are attached via a length of cable or cable segment 920 (see FIG. 9) to a backshell 750 via a protective tube 760 surrounding the cable segment 920. The backshell 750 houses a plurality of bent contacts (not shown), each coupled both to a conductor 910 of the thermocouple assembly 160 (e.g. by welding) and to a corresponding pin (not shown) of a connector 770.

FIG. 8 is a perspective view of one embodiment of the thermocouple tip 710 shown in FIG. 7. The thermocouple tip 710 comprises a tubular member 810 with a first end 812 and a second end 814. The tubular member 810 has an opening 816 and a pair of slots 818 formed on the surface of the tubular member 810 through each of which passes a resilient member 820 with two ends 822 and 832. The ends 822 and 832 of the resilient member 820 are attached to the outer surface of the tubular member 810 at the second end 814 by brazing or other attachment methods known in the art. A contact surface 830 is attached to the resilient member 820 by brazing or other common attachment methods known in the art. The resilient member 820 is biased so that the contact surface 830 protrudes out of the opening 816 of the first end 812 of the tubular member 810. A conductor 910 comprising two wires, shown in FIG. 9, is attached to the inner side of the contact surface 830 by brazing or other common attachment methods known in the art, thus forming a thermocouple junction or temperature sensor.

The contact surface 830 can be any shape but preferably has a low mass with a smooth surface. The contact surface 830 is preferably made of a ceramic material selected from the group consisting of silicon carbide, silicon nitride, aluminum nitride, synthetic diamond and derivatives thereof. Other materials possessing fast response time and excellent thermal conductivity that do not react with process chemistries are also acceptable. The choice between these materials is process dependent.

The resilient member 820 is preferably a spring loaded device like a leaf spring, compression spring, flat spring, or conical spring but can also be any resilient or bendable wire providing the desired characteristics. The resilient member 820 is of such length and shape so that in both the resilient members 820 compressed and uncompressed state the resilient member 820 extends past the opening 816 of the first end 812 of the tubular member 810. Full contact between the thermocouple junction and the substrate surface is assured by the over travel allowance of the thermocouple tip 710. Further, full contact with the substrate surface is assured by the gimbal action of the thermocouple tip 710. The resilient member 820 comprises any suitable spring type material such as aluminum, stainless steel (e.g. INCONEL®) and other high strength, corrosion resistant metal alloys that do not react with process chemistries.

FIG. 9 is a cross sectional view of the exemplary thermocouple assembly 160 of FIG. 7 taken along line 9-9. FIG. 9 shows the cable segment 920 enclosed within the protective tube 760. The cable segment 920 comprises insulated cable which has sufficient flexibility to resist breakage when the entire thermocouple assembly 160 is fixed at either end but stiff enough to allow the cable segment 920 to be inserted into the protective tube 760. The cable segment 920 comprises at least one conductor 910 insulated with a highly compressed refractory mineral insulation enclosed in a liquid-tight and gas-tight continuous protective tube 760. The protective tube 760 comprises any suitable material such as aluminum, stainless steel (e.g. INCONEL®) and other high strength, corrosion resistant metal alloys that do not react with process chemistries.

The conductor 910 is attached by brazing or other attachment methods known in the art to the opposite surface of the contact surface 830 to form the thermocouple junction attached to the resilient member 820. If the conductor 910 is soldered to the contact surface 830, care must be taken to use a minimal amount of solder because a large mass of solder will decrease the rate of response by conducting heat away from the junction and will also interfere with the proper flexure of the resilient member 820.

The thermocouple is inserted into the hole 634 of the e-beam chamber 600 of FIG. 6 such that the tapered bushing 730 of the thermocouple assembly 160 mates against a tapered stop (not shown) formed within the hole 634 of the e-beam chamber 600, and the contact surface 830 extends beyond the hole 634 and is disposed in the vacuum chamber. The tapered bushing 730 and the stop, when mated together, form a stop mechanism that secures the thermocouple assembly 160 to the e-beam chamber 600, stops the thermocouple assembly 160 when proper contact between the substrate surface (not shown) and the thermocouple contact surface 830 are achieved and also forms a seal. The stop mechanism also makes the thermocouple assembly 160 easily removable. Tapered surfaces are used in the stop mechanism to allow easy disengagement of the thermocouple assembly 160. Those skilled in the art should recognize that the tapered bushing 730 and stop do not necessarily have to be tapered and may be of any shape and size adapted to mate with one another.

Figure 10B:
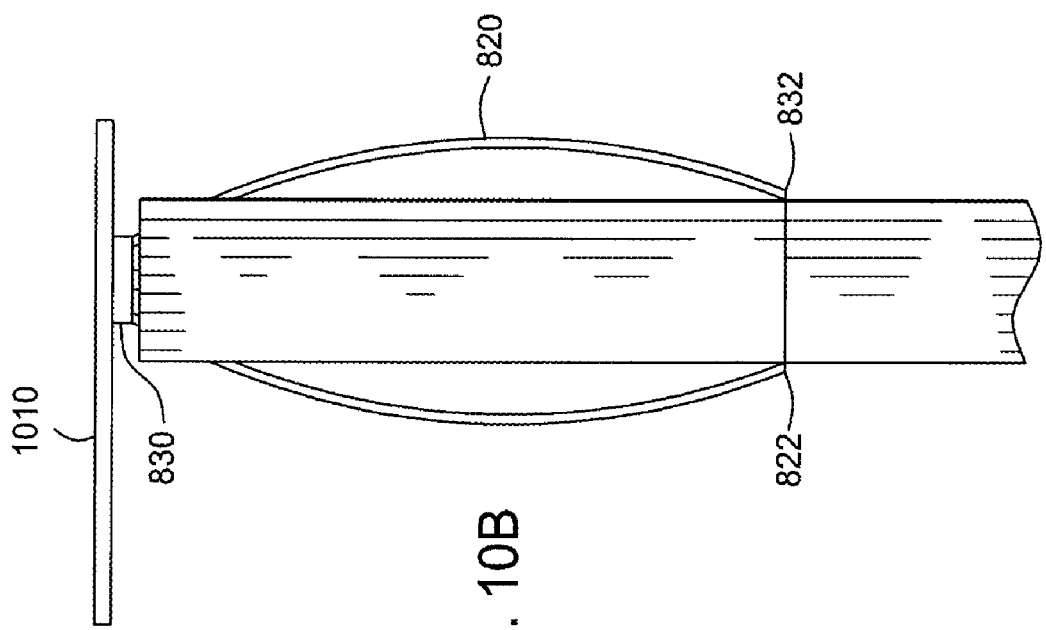
FIG. 10B is a schematic view of the thermocouple tip after contacting the substrate.
Figure 10A:
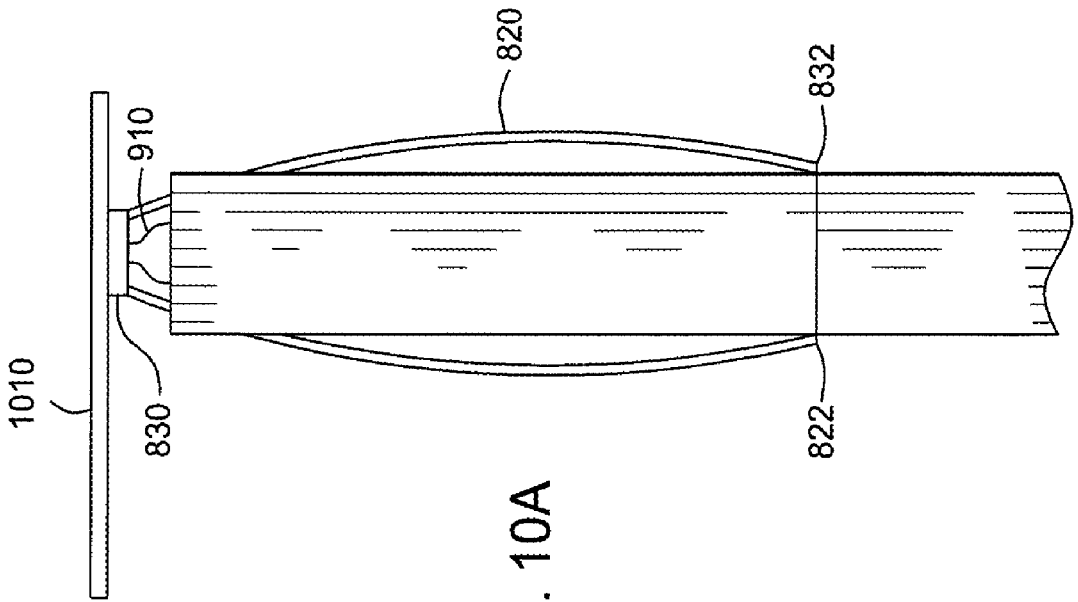
FIG. 10A is a schematic view of the thermocouple tip upon initially contacting a substrate.

In operation, the substrate with the low dielectric constant film thereon to be exposed with the electron beam is placed on the target plane 630. FIG. 10A is a schematic view of the contact surface 830 and resilient member 820 of the thermocouple tip 710 upon initially contacting a substrate surface 1010. The resilient member 820 is in an unbiased position. As shown in FIG. 10B, when the substrate surface 1010 makes contact with the contact surface 830 of the thermocouple tip 710, the downward force provided by the weight of the substrate surface 1010 biases the resilient member 820. The biasing of the resilient member 820 allows the contact surface 830 to maintain contact with the substrate surface 1010 while also allowing the substrate to contact the target plane 630.

During processing, a voltage is developed between the two wires of the conductor 910 attached at the thermocouple junction and the unattached end of the wires or reference junction which is maintained at a known temperature. The difference in temperature between the thermocouple junction and the reference junction generates an electromotive force that is proportional to the temperature difference. This measured voltage is transmitted through the conductor 910 to the controller 150 and used to determine the temperature of the substrate.

Embodiments of the processing chamber 600 are operated by a control system. The control system may include any number of controllers, such as controller 150, processors and input/output devices. In one embodiment, the control system is a component of a closed loop feedback system which monitors various parameters within the process chamber 600 while processing a substrate, and then issues one or more control signals to make necessary adjustments according to various setpoints. In general, the parameters being monitored include temperature, pressure, and gas flow rates.

The X Lamp Heater:

Embodiments of the present invention also provide a heating device or heating device 113; preferably, the heating device 113 is a cross lamp heating assembly. Although discussed with reference to electron beam chambers, the heating device 113 may also be used with other processing chambers including but not limited to CVD, PVD, PECVD chambers.

Figure 11:
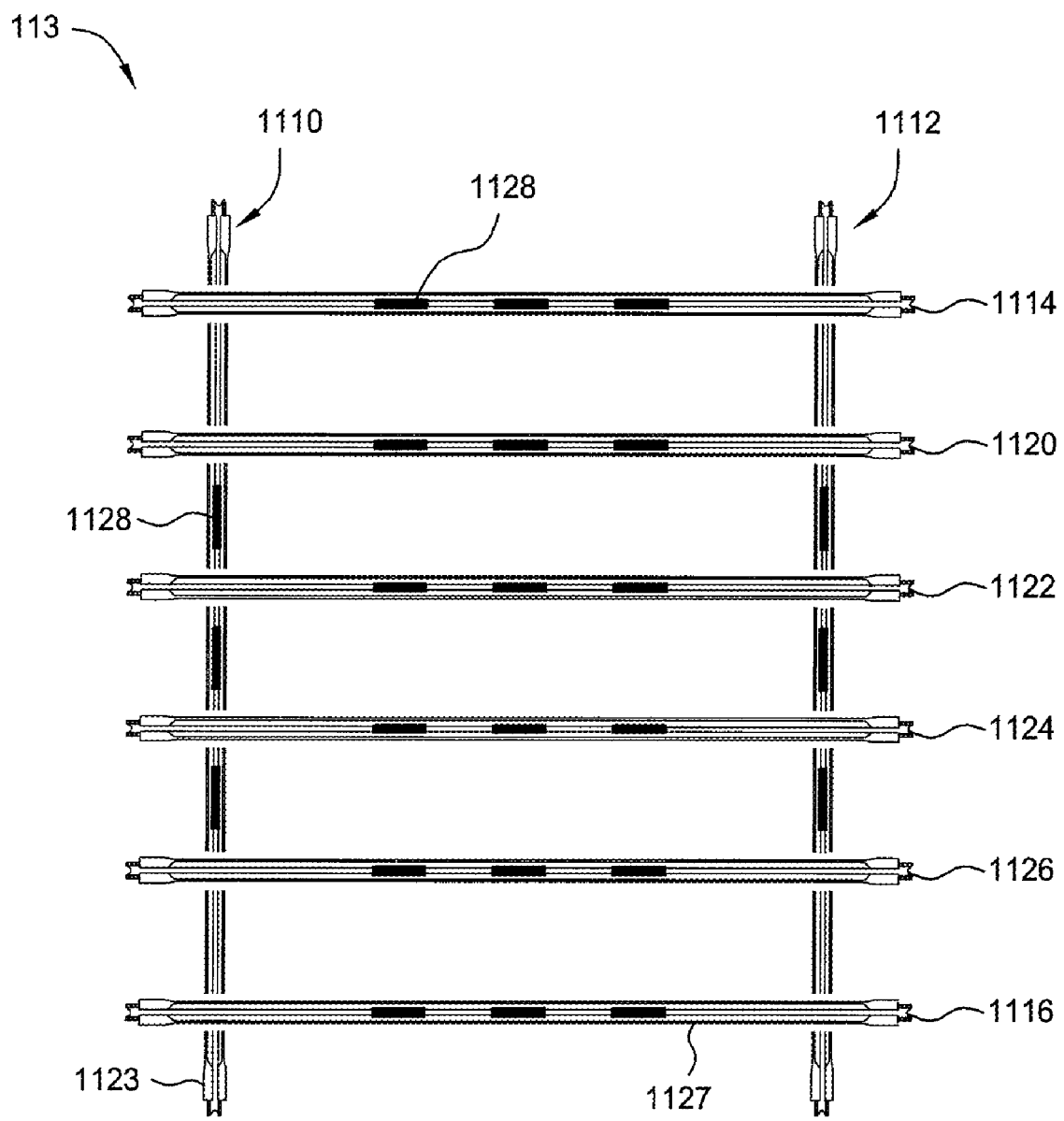
FIG. 11 is a perspective view of one embodiment of a heating device.

FIG. 11 is a perspective view of one embodiment of a heating device 113. The heating device 113 is preferably a cross-lamp heating device. In the illustrative embodiment, the heating device 113 may comprise one or more lamps, including but not limited to argon lamps, halogen lamps, halogentungsten lamps, high-powered arc lamps, capacitance coupled lamps, microwave sources, or UV light sources. The heating device 113 can be configured to produce between one and three temperature control zones. In one embodiment where the heating device 113 has two temperature control zones, the heating device 113 has an outer zone comprising four lamps 1110, 1112, 1114, and 1116 in a crossed configuration. The heating device 113 also has an inner zone comprising four lamps 1120, 1122, 1124, and 1126 in a parallel configuration. The lamps may be arranged in any desired geometry but it is preferred that at least two of the lamps cross within at least one temperature zone, and that the lamp configuration provides a minimum of two temperature zones. In one embodiment, each zone can be between 1 and 100 kilowatts, more preferably, each zone is about 3 kilowatts for a total of 6 kilowatts. In one embodiment, the filaments 1128 of the lamps in each zone have the same length. In another embodiment, the filaments of the lamps in each zone have different filament lengths to better define the temperature profile and uniformity. These filament lengths are illustrative and other filament lengths may be used to produce the desired temperature profile. The refractor (not shown) separating the two zones is part of the main housing thereby increasing rigidity and cooling of the reflector 1720 (shown in FIG. 18). In one embodiment, the lamp electrical connectors 1123 are spring loaded. The linear lamps themselves may be spec lamps which conform to the users power, voltage, and filament specifications. Both connector and lamp are on the inside of a quartz tube 1127 which is exposed to atmosphere thereby eliminating any arcing, allowing for natural convective cooling, and eliminating the lamp as a source of contamination. The lamp may be removed from the quartz tube 1127 without disturbing the vacuum of the chamber.

To verify the lamp module design, Lamp Irradiance Simulation was performed. The modeling demonstrated both the inner and outer zone irradiance patterns and was also able to verify the patterns controllability. Changing inner and outer zone power settings demonstrated the capability of producing a flat, concave or convex irradiation pattern along with a smooth transition between zones.

Figure 12A:
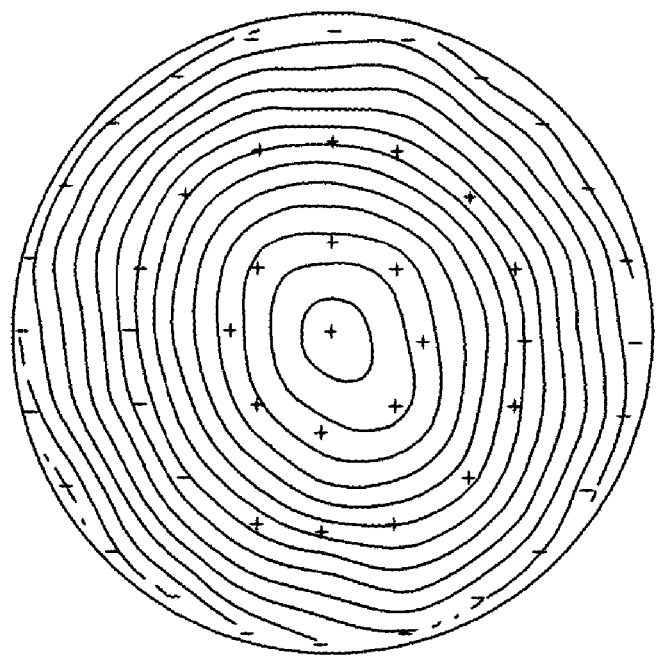
FIG. 12A shows shrinkage uniformity for a 300 mm substrate using an old heater design.

FIG. 12A shows shrinkage uniformity for a 300 mm substrate using an old heater design. The original EBk™ lamp module at 400° C. set point was only capable of a range no better than 20° C. across a 300 mm substrate. This resulted in shrinkage uniformity values (3σ) of 26% on a 1500 Å low-k film as shown in FIG. 12A.

Figure 12B:
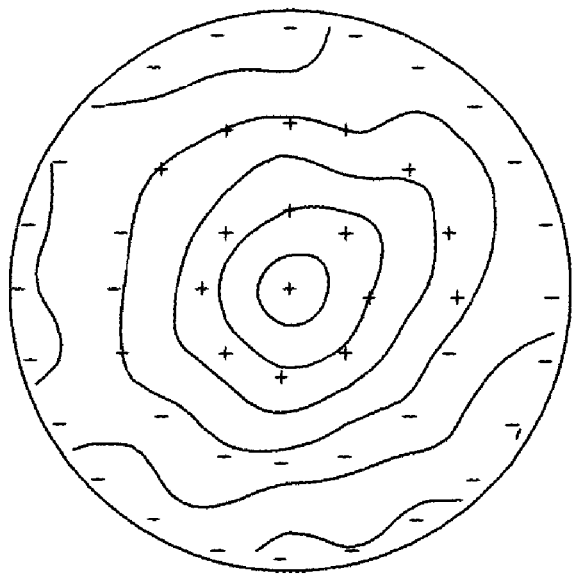
FIG. 12B shows shrinkage uniformity for a 300 mm substrate using the heating device of one embodiment of the current invention.

FIG. 12B shows shrinkage uniformity for a 300 mm substrate using the heating device of the current invention. Using the heating device of the current invention the temperature range across a 300 mm substrate was brought down to 7° C. at a 400° C. set point. This resulted in shrinkage uniformity values (3σ) of 8% on a 1500 Å low-k film as shown in FIG. 12B.

Figure 13:
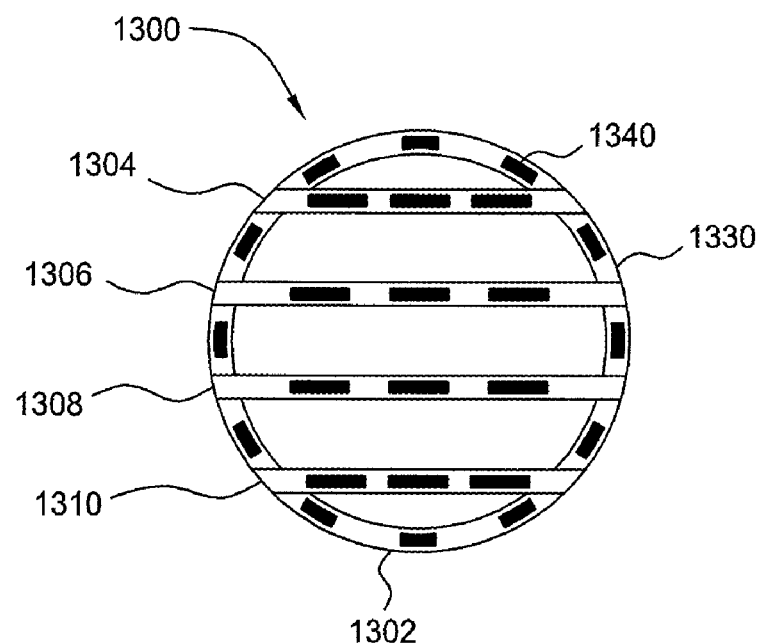
FIG. 13 is a perspective view of another embodiment of a heating device.

FIG. 13 is a perspective view of another illustrative embodiment of a heating device 1300 that may be used with the current invention. The heating device 1300 may also be used with other processing chambers including but not limited to CVD, PVD, and PECVD chambers. The heating device 1300 has an outer zone comprising a ring or circular lamp 1302. The heating device 1300 also has an inner zone comprising four lamps 1304, 1306, 1308, and 1310 in a parallel configuration. In one embodiment, the filaments 1340 of the lamps in each zone have the same length. In another embodiment, the filaments of the lamps in each zone have different filament lengths to better define the temperature profile and uniformity. These filament lengths are illustrative and other filament lengths may be used to produce the desired temperature profile. The filaments 1340 are contained in a tube 1330 preferably made of quartz. Those skilled in the art will recognize that other configurations and geometries are possible.

Figure 14:
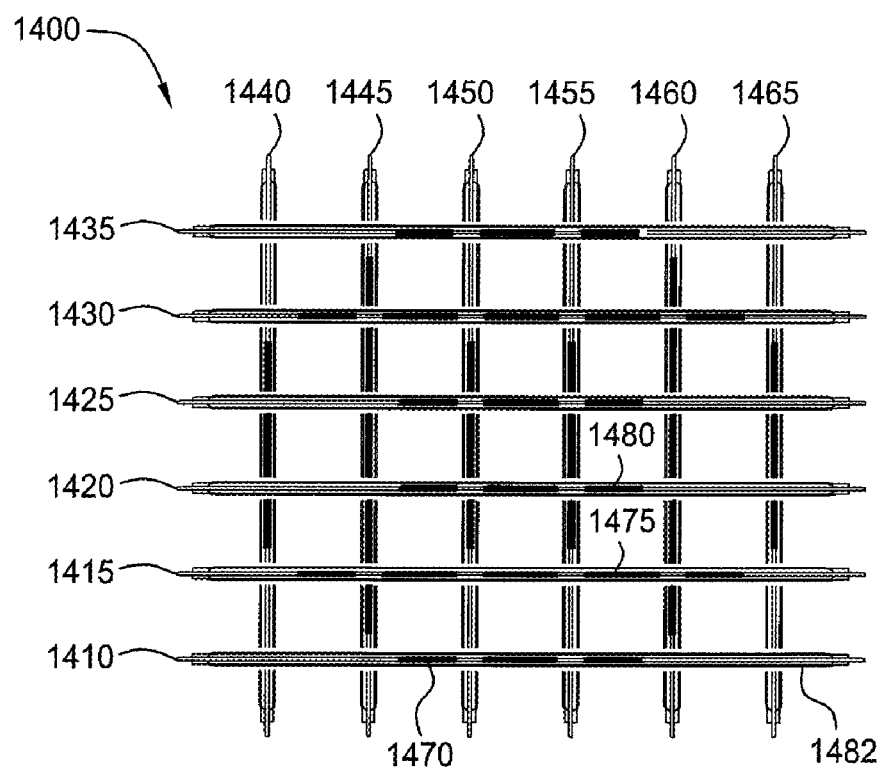
FIG. 14 is a perspective view of another embodiment of a heating device.

FIG. 14 is a perspective view of another embodiment of a heating device 1400 that may be used with the current invention. The heating device 1400 has three temperature control zones. The first zone comprises lamps 1410, 1435, 1440, and 1465. The second zone comprises lamps 1415, 1430, 1445, and 1460. The third zone comprises lamps 1420, 1425, 1450, and 1455. The first zone filaments 1470 have a filament length of approximately 152 mm for a 300 mm substrate. The second zone filaments 1475 have a filament length of approximately 279 mm for a 300 mm substrate. The third zone filaments 1480 have a filament length of approximately 152 mm for a 300 mm substrate. These filament lengths are illustrative and other filament lengths may be used to produce the desired temperature profile. Both connector and lamp are on the inside of a quartz tube 1482 which is exposed to atmosphere thereby eliminating any arcing, allowing for natural convective cooling and eliminating the lamp as a source of contamination. The lamp may be removed from the quartz tube 1482 without disturbing the vacuum of the chamber.

Figure 17:
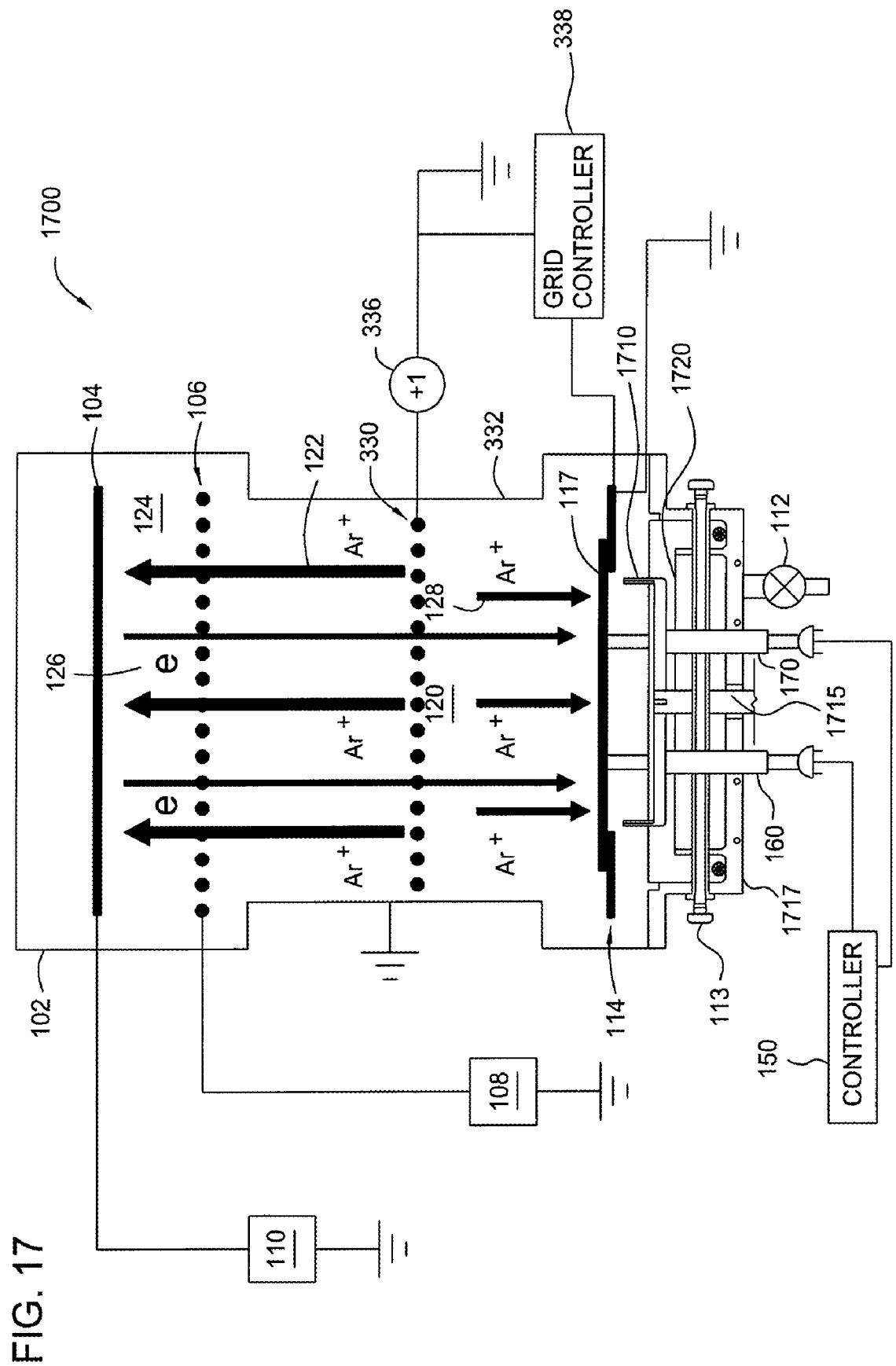
FIG. 17 is a cross-sectional view of an electron beam apparatus according to another embodiment of the invention.

FIG. 17 is a cross-sectional view of another electron beam apparatus 1700 that may be used for practicing embodiments of the invention. Components that are identical to the components of the electron beam apparatus of FIG. 1 and FIG. 3 are labeled with identical reference numbers. Like apparatus 300 of FIG. 3 substrate support 114 of FIG. 17 is not connected to a substrate bias source. While the substrate support 114 of FIG. 17 is shown as a ring, a substrate in the apparatus 1700 of FIG. 17 may actually be supported by a combination of thermocouples and pins (not shown). As discussed above, the thermocouples are used to measure temperature. The first thermocouple 160 may be placed in a position to measure the temperature at the inner area of the substrate 117. The second thermocouple 170 may be placed toward the outer radius of the substrate 117 so as to measure the temperature toward the outer radius. In another embodiment, the second thermocouple 170 is used to measure the temperature on the substrate support 114. Both thermocouple assemblies 160 and 170 are connected to a controller 150. In other embodiments any multiple of thermocouple assemblies may be included in the vacuum chamber 102. Other thermocouple arrangements are also contemplated by the invention.

FIG. 17 also includes a substrate pin lift 1710 and a reflector plate 1720. The substrate pin lift 1710 is configured to lift the substrate 117 onto and off of the substrate support 114. In one embodiment, the substrate pin lift 1710 comprises a quartz material. The substrate pin lift 1710 is connected to a stem 1715. The stem 1715 is disposed through an aperture formed in the bottom of electron beam apparatus 1700 and connects the substrate pin lift 1710 to a lift mechanism (not shown). The stem 1715 is typically hollow and/or includes passages formed therethrough to facilitate coupling of power leads, sensors, control lines, fluid lines and other utilities from the substrate pin lift 1710 to the exterior of the electron beam apparatus 1700. In one embodiment, the stem comprises a quartz material.

The reflector 1720, located below the substrate 117, allows for the radiated properties of the substrate 117 to be substantially independent of the emissivity of the substrate 117. The reflector 1720 may be flat, curved, or any other shape that allows the fine tuning of the substrate properties desired. In one embodiment (not shown), the reflector 1720 may be placed above the substrate 117. The reflector 1720 is generally placed above the substrate 117 in high temperature settings. In another embodiment (not shown), the bottom wall 1717 of the chamber 1700 functions as a reflector. In this embodiment, the bottom wall 1717 of the chamber 1700 includes a top surface 1719 (see FIG. 19) for reflecting energy onto the backside of the substrate 117. Reflections between the backside of the substrate 117 and reflecting surface create a blackbody cavity which makes temperature measurement by the thermocouples (not shown) independent of substrate backside emissivity and thereby provides accurate temperature measurement capability. In the embodiment, the reflective surface is in the form of an absorbing reflector plate that is reflective at wavelengths of 300-2000 nm and reflective at other wavelengths emitted by the radiant energy assembly. The reflector 1720 is positioned below and adjacent to the substrate 117, between about 5 cm to about 25 cm, preferably less than about 15 cm. The reflector 1720 allows for improved substrate to substrate temperature control, thus improving uniformity between substrates.

The grid 330 is connected with a grid controller 338. In this embodiment, the grid controller 338 is connected with the substrate support 114. The grid controller 338 allows the user to input a substrate current "set point" into the grid controller 338 based on the selected process recipe and desired results. In a closed loop configuration, the current leaving the substrate is measured via the substrate support 114 and relayed to the grid controller 338. The grid controller 338 adjusts the voltage of the grid 330 until the substrate current equals the "set point." In another embodiment (not shown), the grid controller 338 is connected with at least one of the first thermocouple 160 and the second thermocouple 170. The first thermocouple 160 and the second thermocouple 170 are used to measure the current leaving the substrate.

While FIGS. 1, 4, 5, and 17 have been shown and described as providing separate solutions for neutralizing the electron beam charge on the substrate, any combination of the methods and apparatus described herein with respect to FIGS. 1, 4, 5, and 17 may be used to reduce charging damage to a substrate during electron beam treatment. For example, a substrate may be treated with an electron beam in a chamber having both a positively biased grid between the anode and the substrate support and a plasma flood gun that provides low energy positive ions to the chamber during the electron beam treatment. Preferably, the plasma flood gun introduces the low energy positive ions into the chamber between the grid and the substrate support. Also, a substrate may be treated with an electron beam in a chamber having both a positively biased grid between the anode and the substrate support and a substrate bias source that supplies a negative bias to the substrate during the electron beam treatment.

Figure 18:
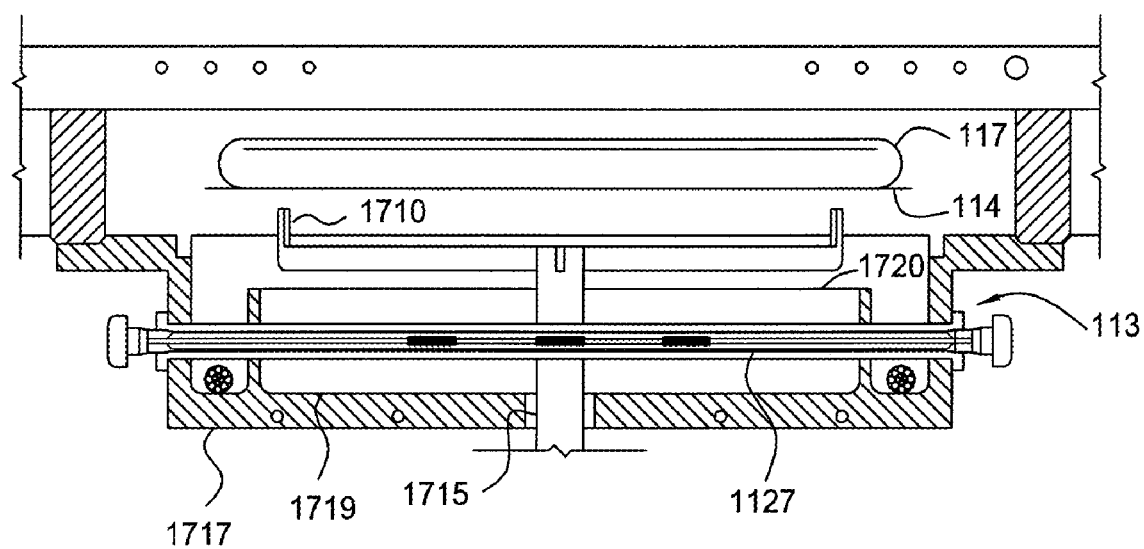
FIG. 18 is a cross-sectional view of a lower portion of an electron beam apparatus according to one embodiment of the invention.

FIG. 18 is a cross-sectional view of a lower portion of the electron beam apparatus 1700 according to one embodiment of the invention. FIG. 18 shows the substrate pin lift 1710 connected to the stem 1715, the substrate support ring 114, the substrate 117, and the heating device 113. The bottom wall 1717 which includes a top surface 1719 is also shown. As discussed above, the heating device 113 comprises a lamp placed inside a tube 1127. The tube 1127 may comprises any material known in the art but is preferably quartz. The lamp may be removed from tube 1127 and replaced without disturbing the vacuum of the chamber.

Figure 19:
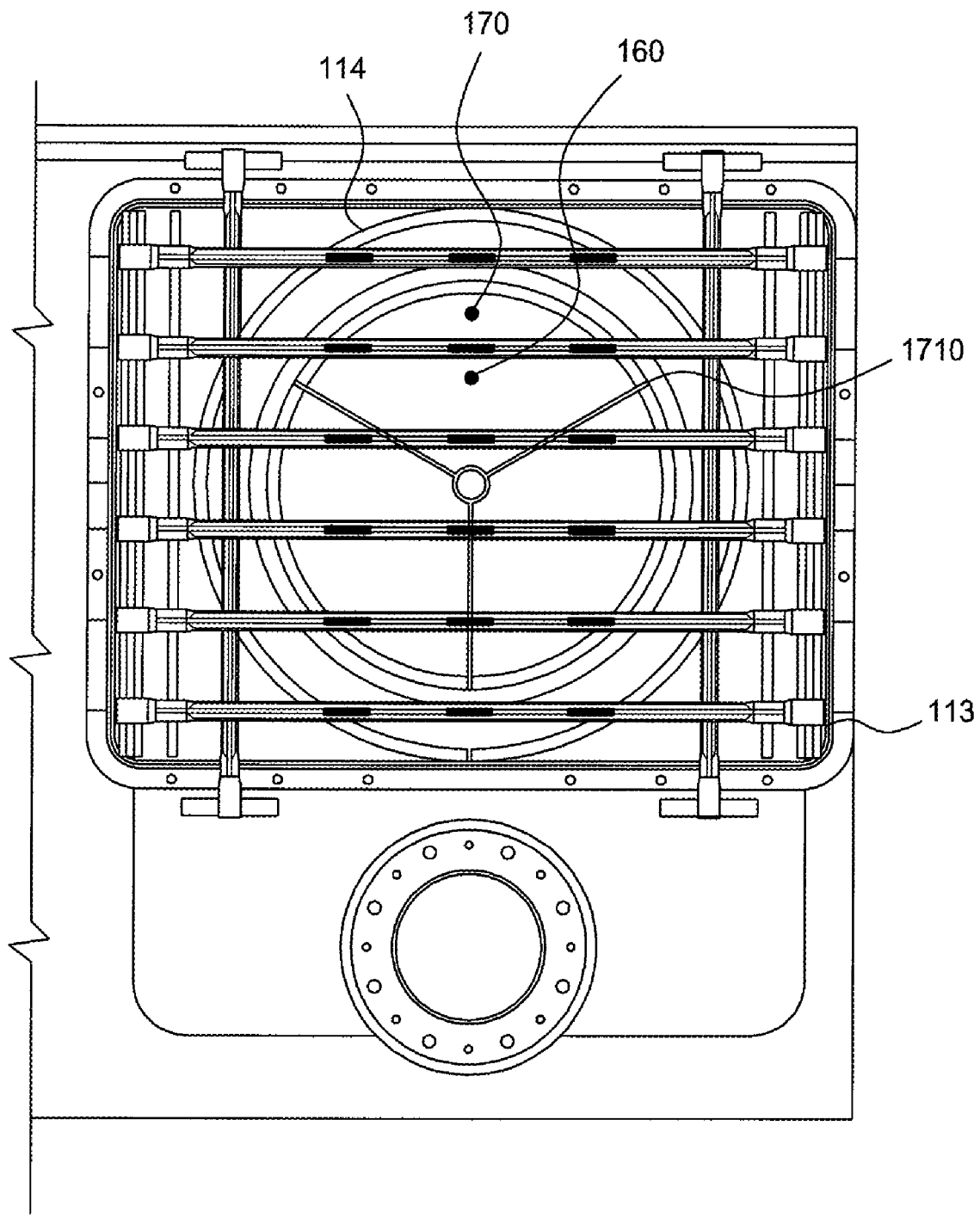
FIG. 19 is a bottom view of the lower portion of the electron beam apparatus according to one embodiment of the invention.

FIG. 19 is a bottom view of the lower portion of the electron beam apparatus according to one embodiment of the invention. FIG. 19 shows the substrate pin lift 1710, the substrate support ring 114, the location of the first thermocouple 160 and the second thermocouple 170 relative to the substrate support ring, and the heating device 113. The first thermocouple 160 is positioned to measure temperature on the substrate. The second thermocouple 170 is positioned to measure the temperature on the substrate support ring 114. In another embodiment, the second thermocouple 170 is positioned to measure the temperature on the outer area of the substrate. In yet another embodiment, the second thermocouple 170 measures the temperature just off of the substrate. Other embodiments contemplate the use of more than two thermocouples or less than two thermocouples. The substrate pin lift 1710 and the substrate support ring 114 may be removed in order to configure the electron beam apparatus for either 200 mm or 300 mm substrates. To convert from the 300 mm substrate to the 200 mm substrate all that is required is a substrate size specific SiC coated graphite preheat ring used to eliminate substrate edge loss by running at a higher temperature.

While the foregoing is directed to embodiments of the present invention, other and further embodiments of the invention may be devised without departing from the basic scope thereof, and the scope thereof is determined by the claims that follow.

The invention claimed is:

1. An electron beam apparatus for processing a substrate comprising:
   a vacuum chamber comprising:
      an electron source comprising:
         an anode;
         a low voltage source connected to the anode;
         a cathode; and
         a high voltage source connected to the cathode;
      a substrate support;
      a grid configured to reduce charge damage to the substrate during electron beam treatment, wherein the grid is located between the anode and the substrate support, and the grid comprises aluminum and contains staggered round holes extending therethrough; and
      a positive voltage bias source connected to the grid.

2. The electron beam apparatus of claim 1, wherein the vacuum chamber further comprises a cross lamp heating device.

3. The electron beam apparatus of claim 1, wherein the vacuum chamber further comprises at least one thermocouple assembly.

4. The electron beam apparatus of claim 1, wherein the substrate support comprises at least one thermocouple assembly.

5. The electron beam apparatus of claim 4, wherein the thermocouple assembly comprises a resilient member made of a ceramic material.

6. The electron beam apparatus of claim 5, wherein the ceramic material is selected from the group consisting of silicon carbide, silicon nitride, aluminum nitride, synthetic diamond, and combinations thereof.

7. The electron beam apparatus of claim 1, wherein the vacuum chamber further comprises a substrate bias source connected to the substrate support.

8. The electron beam apparatus of claim 1, wherein each of the staggered round holes has a diameter of about 0.125 cm.

9. The electron beam apparatus of claim 2, wherein the cross lamp heating device is located below the substrate support and comprises two or more parallel arrays positioned such that the first parallel array intersects the second parallel array.

10. A method for reducing charging damage to a substrate during electron beam treatment, comprising:
    heating a chamber comprising a grid to a chamber temperature within a range from about 200° C. to about 600° C., wherein the grid comprises aluminum, contains staggered round holes extending therethrough, and is located between an anode and a substrate support within the chamber; and
    applying a positive voltage to the grid from a bias source, wherein the positive voltage is provided at conditions sufficient to fully or partially neutralize the electron beam charge on the substrate.

11. The method of claim 10, wherein the conditions are sufficient to reduce the substrate charge current to less than about 0.005 mA.

12. The method of claim 10, wherein the bias source is a DC bias source.

13. The method of claim 10, wherein the bias source is a RF bias source.

14. The method of claim 10, wherein the substrate comprises a low dielectric constant film, and electron beam treatment of the low dielectric constant film comprises forming voids in the low dielectric constant film.

15. The method of claim 10, wherein the positive voltage is between about 3 V and about 40 V.

16. The method of claim 10, wherein each of the staggered round holes has a diameter of about 0.125 cm.

17. An electron beam apparatus for processing a substrate comprising:
   a vacuum chamber comprising:
      an electron source comprising:
         an anode;
         a low voltage source connected to the anode;
         a cathode; and
         a high voltage source connected to the cathode;
      a substrate support;
      a grid located between the anode and the substrate support, wherein the grid comprises aluminum, contains staggered round holes extending therethrough, and is connected to a positive voltage bias source; and
      a cross lamp heating device located below the substrate support.

18. The electron beam apparatus of claim 17, wherein the vacuum chamber further comprises at least one thermocouple assembly, wherein the at least one thermocouple assembly comprises a resilient member configured to contact the surface of a substrate, and the resilient member comprises a ceramic material.

19. The electron beam apparatus of claim 17, wherein the substrate support comprises at least one thermocouple assembly, and the thermocouple assembly is a resilient member made of a ceramic material.

20. The electron beam apparatus of claim 17, wherein each of the staggered round holes has a diameter of about 0.125 cm.

* * * * *